US012745469B2

(12) United States Patent
Nakamura et al.

(10) Patent No.: US 12,745,469 B2

(45) Date of Patent: Sep. 22, 2026

(54) SOLID-STATE IMAGING ELEMENT AND IMAGING SYSTEM

(71) Applicant: SONY SEMICONDUCTOR SOLUTIONS CORPORATION, Kanagawa (JP)

(72) Inventors: Makoto Nakamura, Nagasaki (JP); Shin Kitano, Kanagawa (JP); Yusuke Murakawa, Nagasaki (JP); Koya Tsuchimoto, Nagasaki (JP); Takuya Hanada, Nagasaki (JP); Yuki Noda, Nagasaki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1002 days.

(21) Appl. No.: 17/796,896

(22) PCT Filed: Feb. 2, 2021

(86) PCT No.: PCT/JP2021/003777

§ 371 (c)(1),
(2) Date: Aug. 2, 2022

(87) PCT Pub. No.: WO2021/161855

PCT Pub. Date: Aug. 19, 2021

(65) Prior Publication Data

US 2023/0058625 A1 Feb. 23, 2023

(30) Foreign Application Priority Data

Feb. 12, 2020 (JP) ................................ 2020-021833

(51) Int. Cl.
*H10F 39/00* (2025.01)
*H10F 39/18* (2025.01)

(52) U.S. Cl.
CPC ......... *H10F 39/8057* (2025.01); *H10F 39/18* (2025.01); *H10F 39/8063* (2025.01); *H10F 39/809* (2025.01); *H10F 39/811* (2025.01)

(58) Field of Classification Search
CPC .... H10F 39/18; H10F 39/8063; H10F 39/809; H10F 39/8057
See application file for complete search history.

(56) References Cited

U.S. PATENT DOCUMENTS 12,027,542 B2 * 7/2024 Joei ........................ H10F 39/192
2004/0130757 A1 7/2004 Mabuchi
(Continued)

FOREIGN PATENT DOCUMENTS

CN 102315236 A 1/2012
CN 109729292 A 5/2019
(Continued)

OTHER PUBLICATIONS

International Search Report and Written Opinion prepared by the Japan Patent Office on Apr. 15, 2021, for International Application No. PCT/JP2021/003777, 2 pgs.

*Primary Examiner* — Errol V Fernandes
(74) *Attorney, Agent, or Firm* — SHERIDAN ROSS P.C.

(57) ABSTRACT

A solid-state imaging element according to the present disclosure is provided with a first substrate (light reception chip) and a second substrate (detection chip). The first substrate (light reception chip) is provided with a photodiode that photoelectrically converts incident light to generate a photocurrent. The second substrate (detection chip) is provided with a luminance change detection circuit (current-voltage conversion circuit) that detects a change in luminance of the incident light on the basis of a voltage signal converted by a conversion circuit (current-voltage conversion circuit) that converts the photocurrent into the voltage signal, and is bonded to the first substrate (light reception
(Continued)

chip). A light shielding unit (light shielding film) provided in at least any one of the first substrate (light reception chip) or the second substrate (detection chip) and shields light between an active element (transistor TR) provided in the second substrate (detection chip) and the photodiode is included.

20 Claims, 18 Drawing Sheets

(56) References Cited

U.S. PATENT DOCUMENTS

2013/0235243 A1 9/2013 Sano et al.
2014/0374865 A1 12/2014 Kobayashi et al.
2015/0122995 A1* 5/2015 Mabuchi ............... H10F 39/811 438/74
2016/0035780 A1 2/2016 Itahashi
2019/0229150 A1* 7/2019 Isono ...................... H10F 39/12
2019/0386052 A1 12/2019 Furuhashi

FOREIGN PATENT DOCUMENTS

EP 3582491 A1 12/2019
JP 2001085661 A 3/2001
JP 2012064709 A 3/2012
JP 2013-187360 9/2013
JP 2018-101699 6/2018
JP 2018-148116 9/2018
KR 20200010040 A 1/2020
WO WO 2013/115075 8/2013
WO WO 2013115075 A1 * 5/2015
WO WO-2018163838 A1 9/2018
WO WO 2019/087471 5/2019
WO WO 2019/087472 5/2019
WO WO 2019/087471 A1 * 9/2020

* cited by examiner 411
412
701
413

721
412
411
722
723
413

721
DA1
411
DB1

SOLID-STATE IMAGING ELEMENT AND IMAGING SYSTEM

CROSS REFERENCE TO RELATED APPLICATIONS

This application is a national stage application under 35 U.S.C. 371 and claims the benefit of PCT Application No. PCT/JP2021/003777, having an international filing date of 2 Feb. 2021, which designated the United States, which PCT application claimed the benefit of Japanese Patent Application No. 2020-021833, filed 12 Feb. 2020, the entire disclosures of each of which are incorporated herein by reference.

TECHNICAL FIELD

The present disclosure relates to a solid-state imaging element and an imaging system.

BACKGROUND ART

A solid-state imaging element used in a dynamic vision system photoelectrically converts incident light into a voltage signal, and detects a change in luminance of the incident light on the basis of the voltage signal (refer to, for example, Patent Document 1).

CITATION LIST

Patent Document

Patent Document 1: International Publication No. 2019/087472

SUMMARY OF THE INVENTION

Problems to be Solved by the Invention

However, in the solid-state imaging element that detects the change in luminance of the incident light, in a case where application of stray light occurs inside, a voltage of the voltage signal fluctuates, and detection accuracy of the change in luminance might be deteriorated.

Therefore, the present disclosure proposes a solid-state imaging element and an imaging system capable of suppressing deterioration in detection accuracy of a change in luminance.

Solutions to Problems

A solid-state imaging element according to the present disclosure is provided with a first substrate and a second substrate. The first substrate is provided with a photodiode that photoelectrically converts incident light to generate a photocurrent. The second substrate is provided with a luminance change detection circuit that detects a change in luminance of the incident light on the basis of a voltage signal converted by a conversion circuit that converts the photocurrent into the voltage signal, and is bonded to the first substrate. A light shielding unit that is provided in at least any one of the first substrate or the second substrate and shields light between an active element provided in the second substrate and the photodiode is included.

MODE FOR CARRYING OUT THE INVENTION

Hereinafter, an embodiment of the present disclosure is described in detail with reference to the drawings. Note that, in each following embodiment, the same parts are denoted by the same reference signs, and the description thereof is not repeated.

1. Configuration Example of Imaging Device

Figure 1:
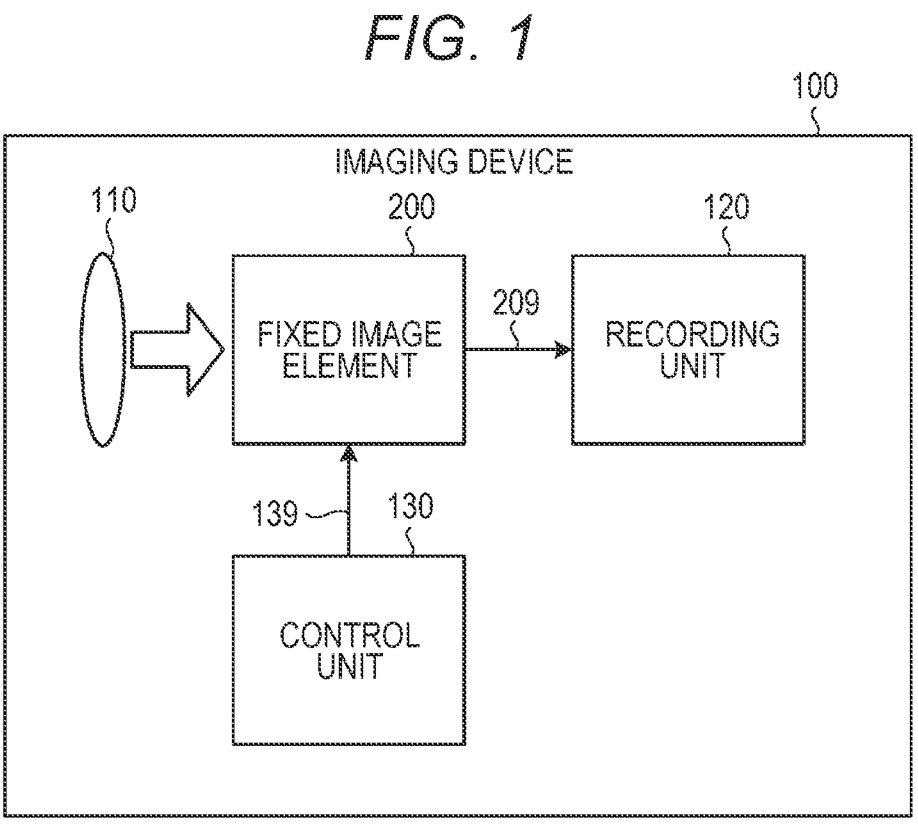
FIG. 1 is a block diagram illustrating a configuration example of an imaging device according to the present disclosure.

FIG. 1 is a block diagram illustrating a configuration example of an imaging device 100 according to the present disclosure. This imaging device 100 is an example of an imaging system that images image data, and is provided with an imaging lens 110, a solid-state imaging element 200, a recording unit 120, and a control unit 130. As the imaging device 100, a camera mounted on an industrial robot, an in-vehicle camera and the like are assumed.

The imaging lens 110 condenses incident light and guides the same to the solid-state imaging element 200. The solid-state imaging element 200 photoelectrically converts the incident light to image the image data. This solid-state imaging element 200 executes predetermined signal processing such as image recognition processing on the imaged image data, and outputs the processed data to the recording unit 120 via a signal line 209.

The recording unit 120 records the data from the solid-state imaging element 200. The control unit 130 controls the solid-state imaging element 200 to image the image data.

2. Configuration Example of Solid-State Imaging Element

Figure 2:
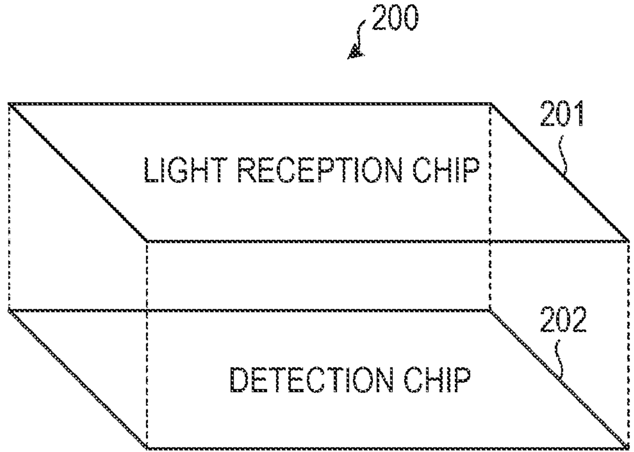
FIG. 2 is a view illustrating an example of a stacked structure of a solid-state imaging element according to the present disclosure.

FIG. 2 is a view illustrating an example of a stacked structure of the solid-state imaging element 200 according to the present disclosure. This solid-state imaging element 200 is provided with a detection chip 202 and a light reception chip 201 stacked on the detection chip 202. These chips are joined by a via and the like. Note that, they may also be joined to each other by Cu—Cu joint or a bump in addition to the via. The detection chip 202 is an example of a signal processing chip that performs signal processing on an output from the solid-state imaging element 200.

Figure 3:
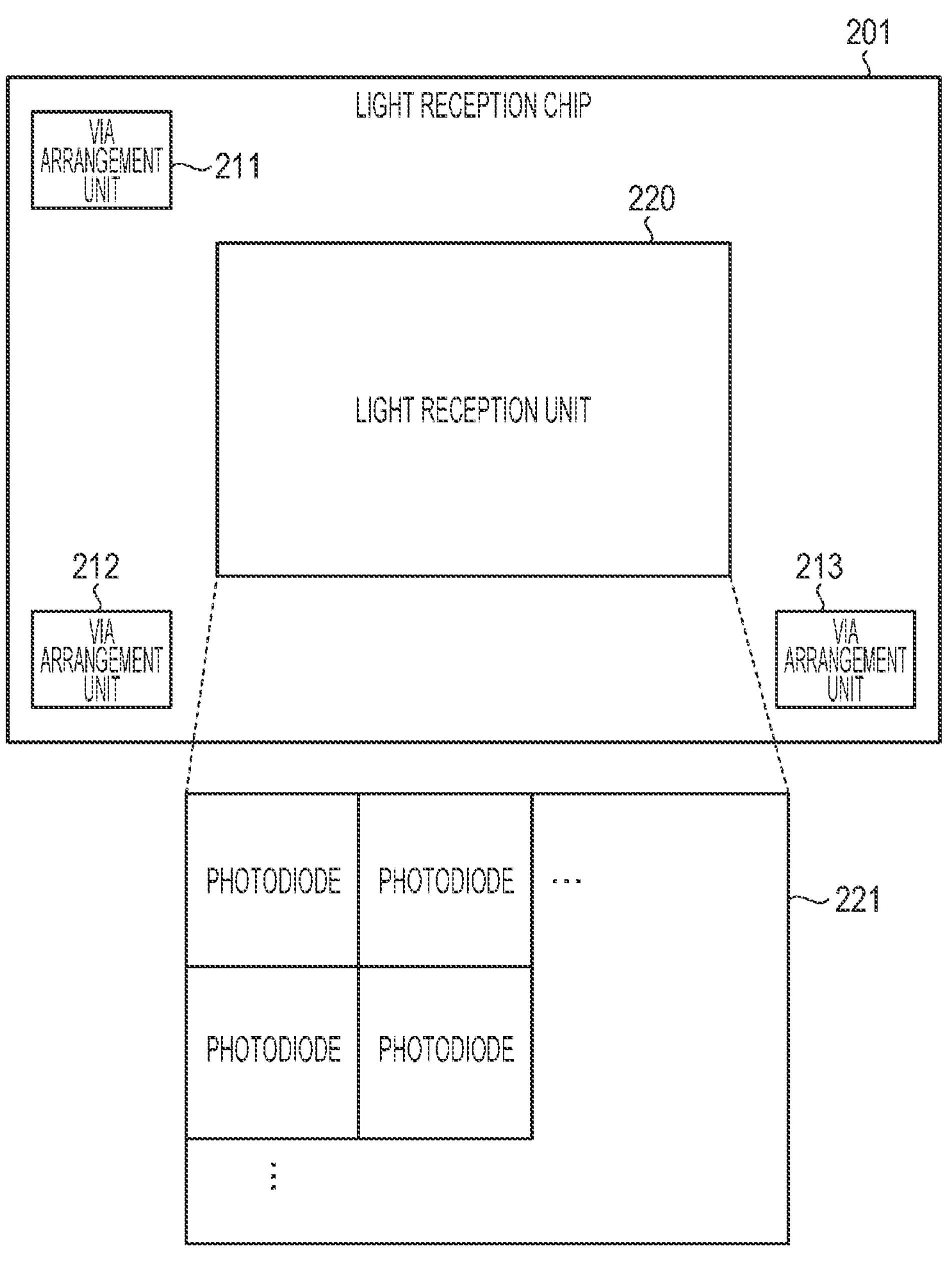
FIG. 3 is an example of a plan view of a light reception chip according to the present disclosure.

FIG. 3 is an example of a plan view of the light reception chip 201 according to the present disclosure. The light reception chip 201 is provided with a light reception unit 220 and via arrangement units 211, 212, and 213.

A via connected to the detection chip 202 is arranged in the via arrangement units 211, 212, and 213. Furthermore, in the light reception unit 220, a plurality of photodiodes 221 is arranged in a two-dimensional lattice manner. The photodiode 221 photoelectrically converts the incident light to generate a photocurrent. Each of the photodiodes 221 to which a pixel address including a row address and a column address is assigned is handled as a pixel.

Figure 4:
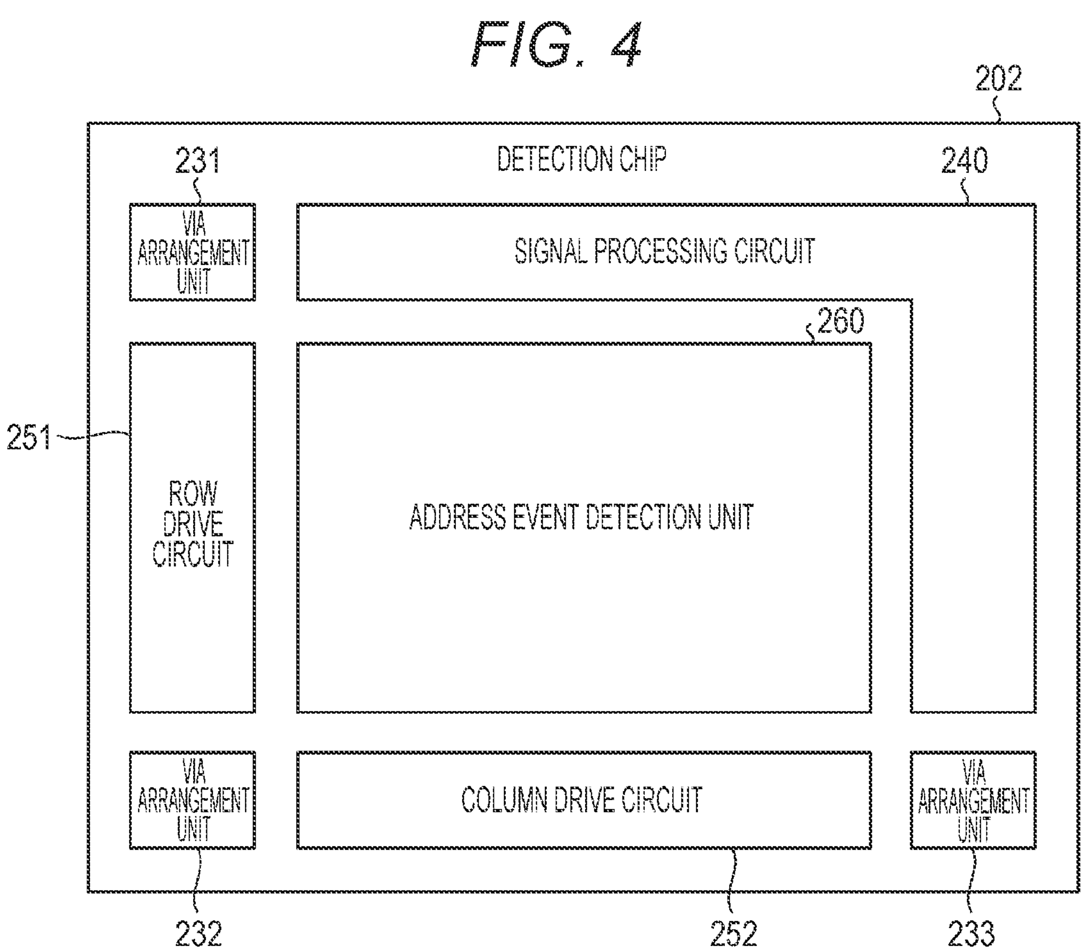
FIG. 4 is an example of a plan view of a detection chip according to the present disclosure.

FIG. 4 is an example of a plan view of the detection chip 202 according to the present disclosure. This detection chip 202 is provided with via arrangement units 231, 232, and 233, a signal processing circuit 240, a row drive circuit 251, a column drive circuit 252, and an address event detection unit 260. A via connected to the light reception chip 201 is arranged in the via arrangement units 231, 232, and 233.

The address event detection unit 260 generates a detection signal from the photocurrent of each of the plurality of photodiodes 221 and outputs the same to the signal processing circuit 240. This detection signal is a 1-bit signal indicating whether or not a fact that a light amount of the incident light exceeds a predetermined threshold is detected as an address event.

The row drive circuit 251 selects the row address and allows the address event detection unit 260 to output the detection signal corresponding to the selected row address.

The column drive circuit 252 selects the column address and allows the address event detection unit 260 to output the detection signal corresponding to the selected column address.

The signal processing circuit 240 executes predetermined signal processing on the detection signal from the address event detection unit 260. This signal processing circuit 240 arranges the detection signals as pixel signals in a two-dimensional lattice manner, and acquires the image data having 1-bit information for each pixel. Then, the signal processing circuit 240 executes signal processing such as image recognition processing on the image data.

Figure 5:
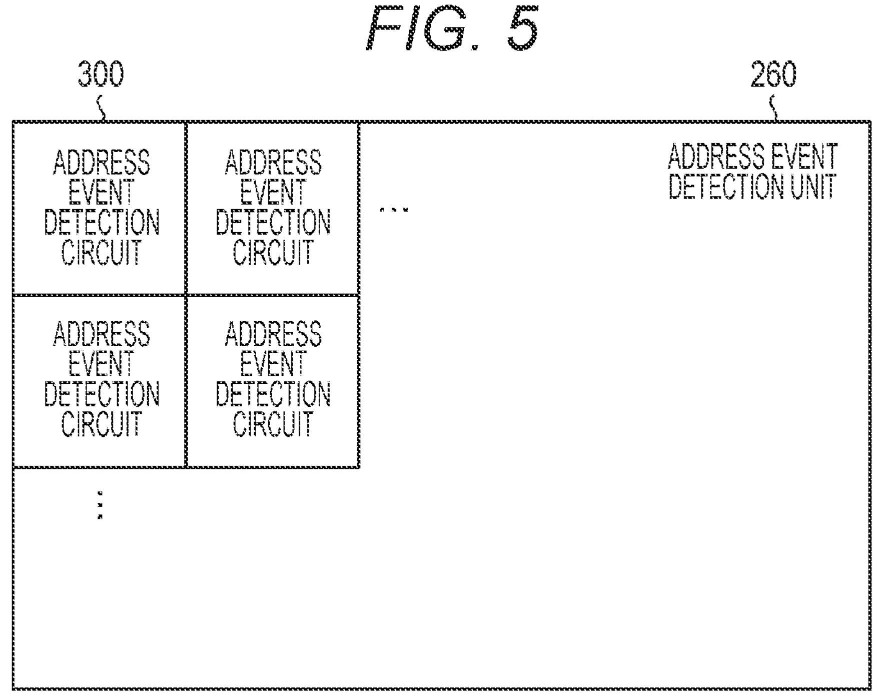
FIG. 5 is an example of a plan view of an address event detection unit according to the present disclosure.

FIG. 5 is an example of a plan view of the address event detection unit 260 according to the present disclosure. In this address event detection unit 260, a plurality of address event detection circuits 300 is arranged in a two-dimensional lattice manner. Each of the address event detection circuits 300 to which a pixel address is assigned is connected to the photodiode 221 having the same address.

The address event detection circuit 300 quantizes a voltage signal corresponding to the photocurrent from the corresponding photodiode 221 and outputs the same as the detection signal.

3. Configuration Example of Address Event Detection Circuit

Figure 6:
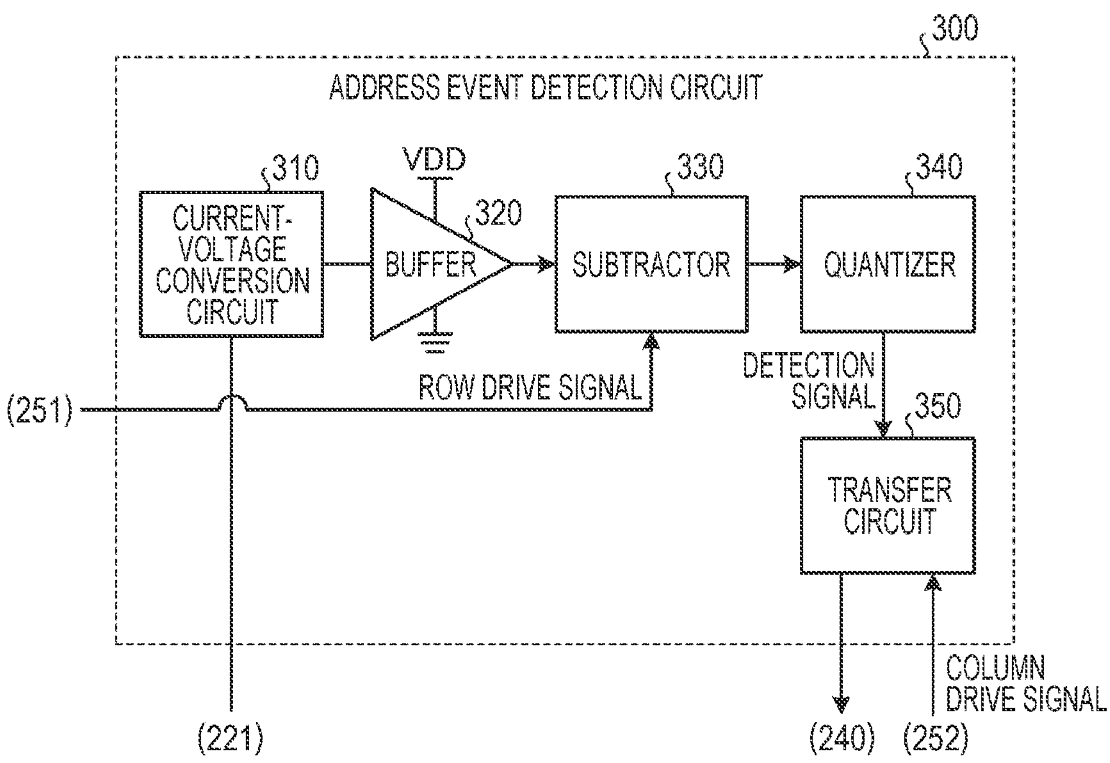
FIG. 6 is a block diagram illustrating a configuration example of an address event detection circuit according to the present disclosure.

FIG. 6 is a block diagram illustrating a configuration example of the address event detection circuit 300 according to the present disclosure. This address event detection circuit 300 is provided with a current-voltage conversion circuit 310, a buffer 320, a subtractor 330, a quantizer 340, and a transfer circuit 350.

The current-voltage conversion circuit 310 converts the photocurrent from the corresponding photodiode 221 into the voltage signal. This current-voltage conversion circuit 310 supplies the voltage signal to the buffer 320.

The buffer 320 corrects the voltage signal from the current-voltage conversion circuit 310. This buffer 320 outputs the corrected voltage signal to the subtractor 330.

The subtractor 330 lowers a level of the voltage signal from the buffer 320 according to a row drive signal from the row drive circuit 251. This subtractor 330 supplies the lowered voltage signal to the quantizer 340.

The quantizer 340 quantizes the voltage signal from the subtractor 330 into a digital signal and outputs the same as the detection signal to the transfer circuit 350.

The transfer circuit 350 transfers the detection signal from the quantizer 340 to the signal processing circuit 240 according to a column drive signal from the column drive circuit 252.

4. Configuration Example of Current-Voltage Conversion Circuit

Figure 7:
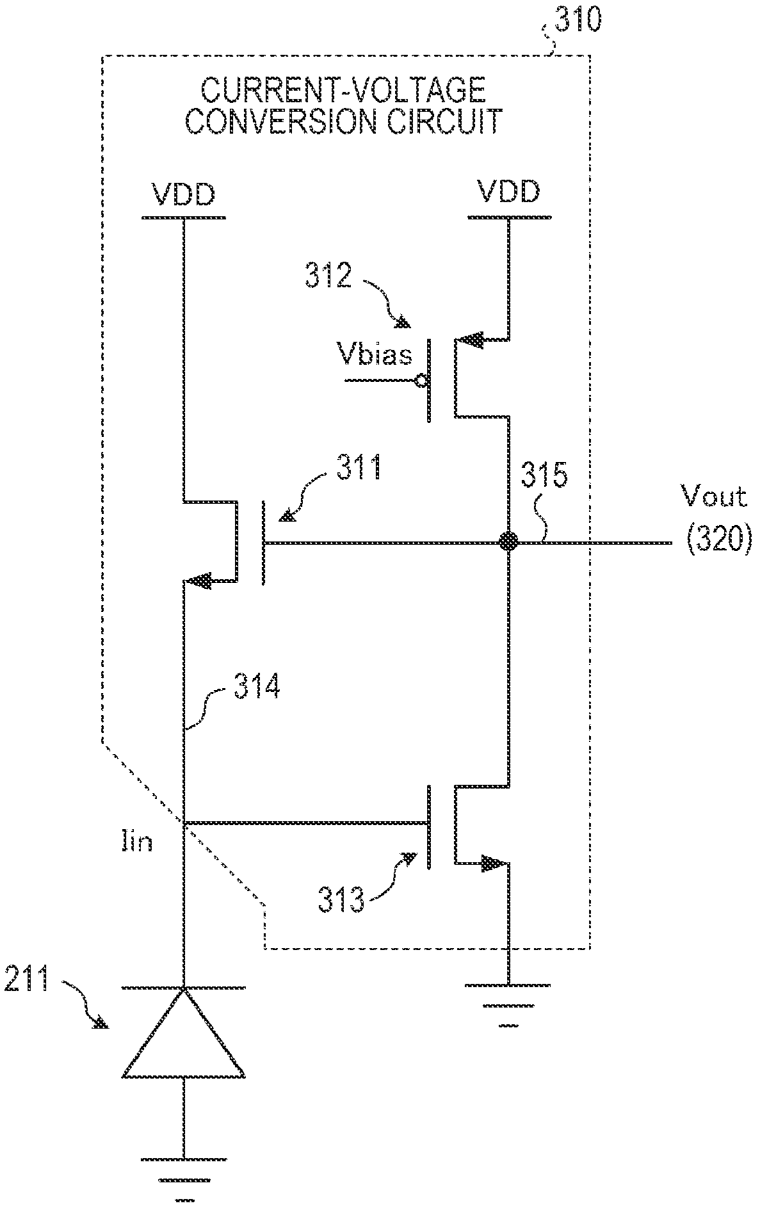
FIG. 7 is a circuit diagram illustrating a configuration example of a current-voltage conversion circuit according to the present disclosure.

FIG. 7 is a circuit diagram illustrating a configuration example of the current-voltage conversion circuit 310 according to the present disclosure of the present technology. This current-voltage conversion circuit 310 is provided with a conversion transistor 311, a current source transistor 312, and a voltage supply transistor 313. As the conversion transistor 311 and the voltage supply transistors 313, for example, an N-type metal-oxide-semiconductor (MOS) transistor is used. Furthermore, a P-type MOS transistor is used, for example, as the current source transistor 312.

The conversion transistor 311 converts a photocurrent $I_{in}$ from the corresponding photodiode 221 into a voltage signal $V_{out}$ and outputs the same from a gate thereof. A source of the conversion transistor 311 is connected to a cathode of the photodiode 221 and a gate of the voltage supply transistor 313 via an input signal line 314. Furthermore, a drain of the conversion transistor 311 is connected to a power supply, and the gate thereof is connected to a drain of the current source transistor 312, a drain of the voltage supply transistor 313, and an input terminal of the buffer 320 via an output signal line 315.

The current source transistor 312 supplies a predetermined constant current to the output signal line 315. A predetermined bias voltage $V_{bias}$ is applied to a gate of the current source transistor 312. A source thereof is connected to the power supply, and the drain thereof is connected to the output signal line 315.

The voltage supply transistor 313 supplies a constant voltage corresponding to the constant current from the output signal line 315 to the source of the conversion transistor 311 via the input signal line 314. Therefore, a source voltage of the conversion transistor 311 is fixed to the constant voltage. Therefore, when the light is incident, a gate-source voltage of the conversion transistor 311 increases according to the photocurrent, and a level of the voltage signal $V_{out}$ increases.

5. Configuration Example of Subtractor and Quantizer

Figure 8A:
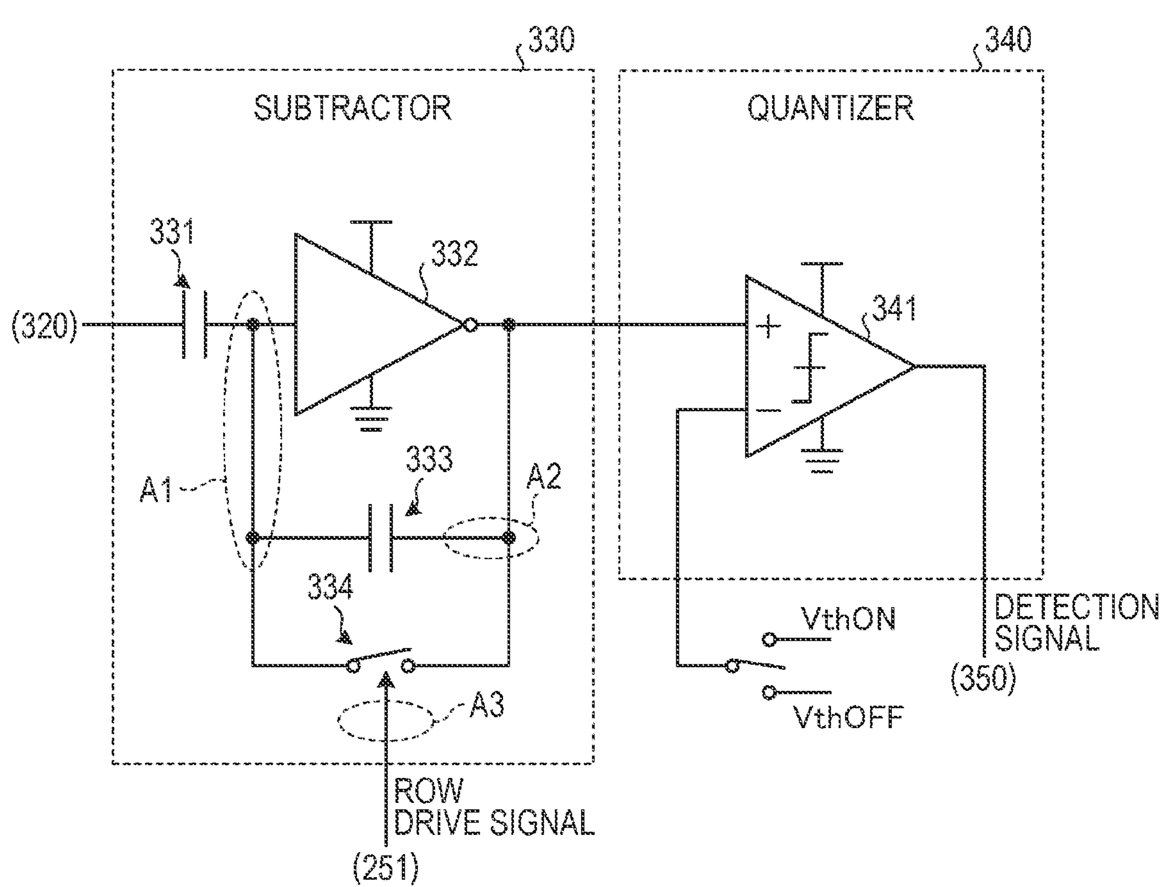
FIG. 8A is a circuit diagram illustrating a configuration example of a subtractor and a quantizer according to the present disclosure.

FIG. 8A is a circuit diagram illustrating a configuration example of the subtractor 330 and the quantizer 340 according to the present disclosure. The subtractor 330 is provided with capacitors 331 and 333, an inverter 332, and a switch 334. Furthermore, the quantizer 340 is provided with a comparator 341.

One end of the capacitor 331 is connected to an output terminal of the buffer 320 and the other end thereof is connected to an input terminal of the inverter 332. The capacitor 333 is connected in parallel with the inverter 332.

The switch 334 includes, for example, a metal-oxide-semiconductor field-effect transistor (MOSFET), and opens and closes a path connecting both ends of the capacitor 333 according to the row drive signal. The switch 334 serves as a reset transistor that discharges and resets the capacitor 333 by connecting both the ends of the capacitor 333.

The inverter 332 inverts the voltage signal input via the capacitor 331. The inverter 332 outputs the inverted signal to a non-inverting input terminal (+) of the comparator 341.

The comparator 341 is, for example, an inverting amplifier, and serves as a luminance change detection circuit that detects a change in luminance of the incident light incident on the photodiode 221 on the basis of the voltage signal input from the subtractor 330.

The comparator 341 compares the voltage signal from the subtractor 330 with predetermined threshold voltages VthON and VthOFF applied to an inverting input terminal (−) to detect the change in luminance of the incident light. The comparator 341 outputs a signal indicating a comparison result to the transfer circuit 350 as the detection signal.

In the comparator 341, for example, in a case where the imaging device 100 is used for face authentication, the threshold voltages VthON and VthOFF input in synchronization with a blinking cycle of a light source that applies blinking light to a face as a subject are switched. The comparator 341 compares the input voltage signal with the threshold voltage VthON in a period in which the light source is turned on. Furthermore, the comparator 341 compares the input voltage signal with the threshold voltage VthOFF in a period in which the light source is turned off.

Figure 8B:
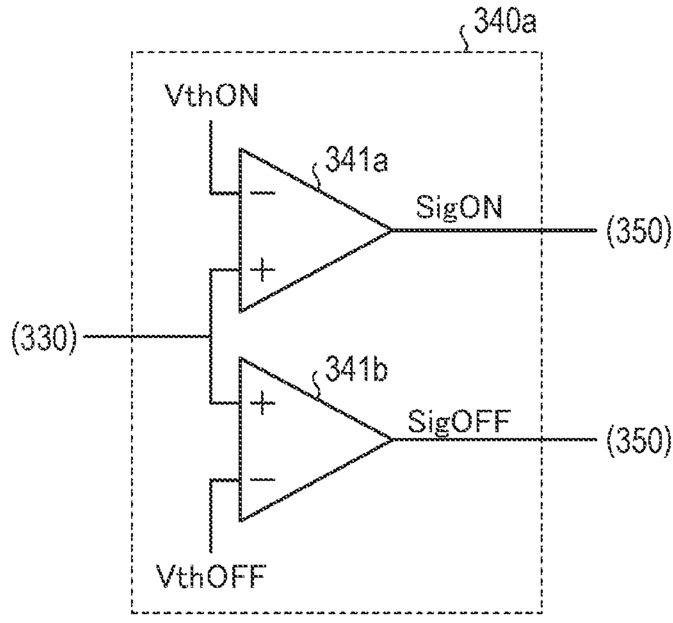
FIG. 8B is a circuit diagram illustrating a variation of the quantizer according to the present disclosure.

Note that, the configuration of the quantizer 340 is not limited to the configuration illustrated in FIG. 8A, and may be, for example, a configuration illustrated in FIG. 8B. FIG. 8 is a circuit diagram illustrating a variation of the quantizer according to the present disclosure. As illustrated in FIG. 8B, a quantizer 340*a* according to the variation is provided with two comparators 341*a* and 341*b* connected in parallel to the input.

The voltage signal is input from the subtractor 330 to the non-inverting input terminals (+) of the comparators 341*a* and 341*b*. The threshold voltage VthON is input to the inverting input terminal (−) of the comparator 341*a*. The threshold voltage VthOFF is input to the inverting input terminal (−) of the comparator 341*b*.

The comparator 341*a* outputs a detection signal SigON indicating a comparison result between the voltage signal and the threshold voltage VthON to the transfer circuit 350. The comparator 341*b* outputs a detection signal SigOFF indicating a comparison result between the voltage signal and the threshold voltage VthOFF to the transfer circuit 350.

By the quantizer 340*a* having such a configuration also, similarly to the quantizer 340 illustrated in FIG. 8A, it is possible to detect the change in luminance of the incident light incident on the photodiode 221 on the basis of the voltage signal input from the subtractor 330 and output a detection result to the transfer circuit 350.

Here, in the quantizers 340 and 340*a*, when parasitic light sensitivity (PLS) of the subtractor 330 is high, the voltage of the input voltage signal fluctuates due to application of stray light or diffusion of light-generation charge in the subtractor 330, and detection accuracy of the change in luminance is deteriorated.

For example, in a case of the configuration illustrated in FIG. 8A, when the application of stray light or diffusion of light-generation charge occurs in impurity diffusion regions A1 and A2 connected to the capacitors 331 and 333, respectively, included in the subtractor 330, photoelectric conversion occurs, and the voltage of the voltage signal input to the quantizer 340 fluctuates.

Furthermore, when the application of stray light or diffusion of light-generation charge occurs in an impurity diffusion region A3 connected to a gate of the switch 334, abnormality occurs in an opening/closing operation of the switch 334, and the voltage of the voltage signal input to the quantizer 340 might fluctuate.

Furthermore, for example, in the address event detection circuit 300, a light emission phenomenon associated with generation of hot carrier (hereinafter, referred to as HC light emission) might occur in the vicinity of a gate electrode of the transistor having a relatively large current amount.

When light by the HC light emission is transmitted through the inside of the solid-state imaging element 200 and is received by the photodiode 221, photoelectric conversion occurs, a dark current and random noise increase, and the detection accuracy of the change in luminance is deteriorated.

Therefore, the solid-state imaging element 200 according to the present disclosure has a configuration of suppressing the deterioration in detection accuracy of the change in luminance due to the application of stray light or diffusion of light-generation charge. Hereinafter, a solid-state imaging element having a configuration of suppressing the deterioration in detection accuracy of the change in luminance according to the present disclosure is specifically described.

6. Solid-State Imaging Element According to Present Disclosure

Figure 9:
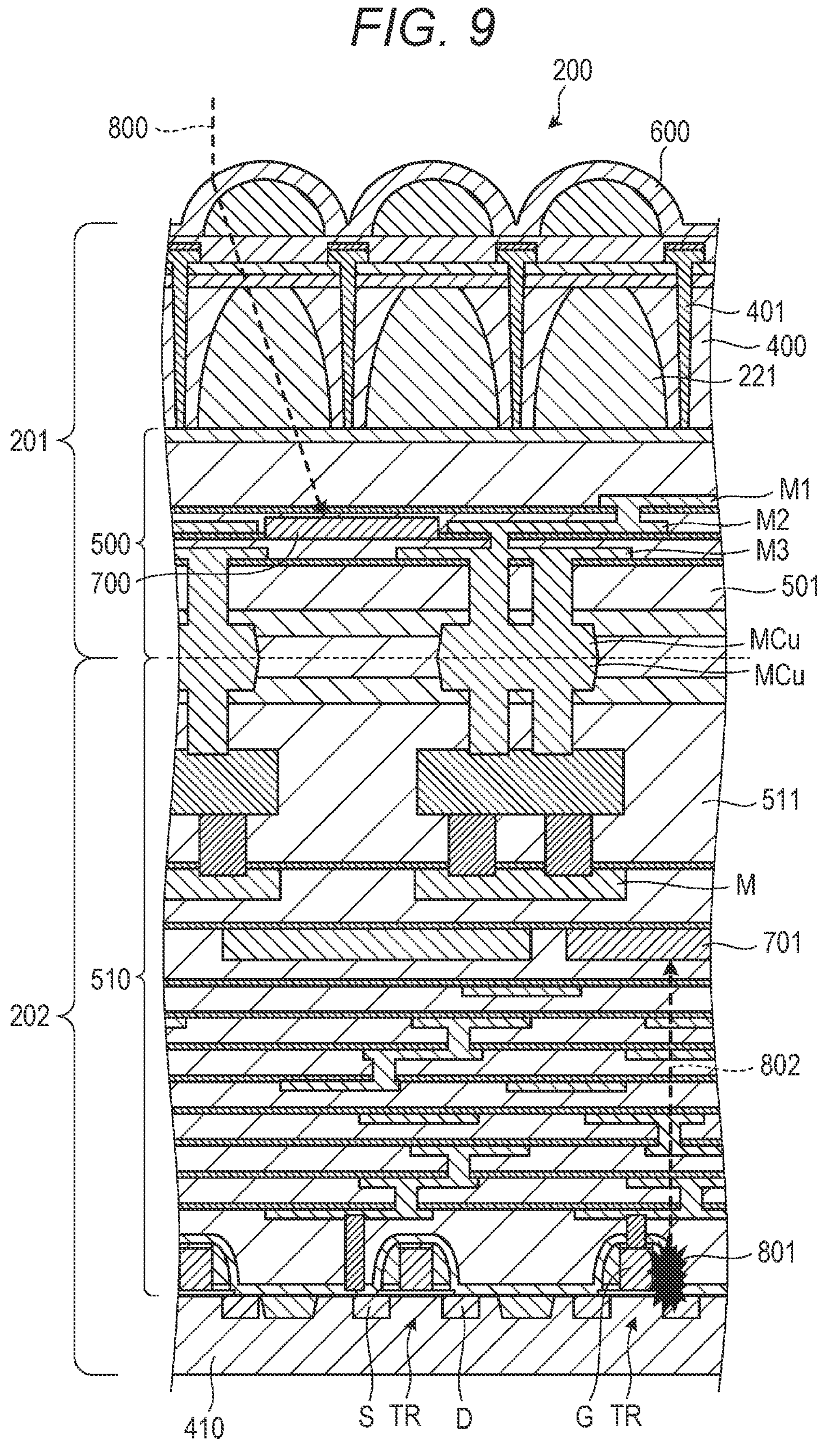
FIG. 9 is a cross-sectional illustrative view of the solid-state imaging element according to the present disclosure.

6-1. Overall Configuration of Solid-State Imaging Element According to Present Disclosure Next, the solid-state imaging element according to the present disclosure is described with reference to FIG. 9. FIG. 9 is a cross-sectional illustrative view of the solid-state imaging element according to the present disclosure. Note that, for convenience, it is hereinafter described assuming that a side of a surface on which light is incident of the solid-state imaging element is an upper side, and a side opposite to the surface on which the light is incident is a lower side.

As illustrated in FIG. 9, the solid-state imaging element 200 according to the present disclosure is provided with the light reception chip 201 as an example of a first substrate on which the photodiode 221 is provided, and the detection chip 202 as an example of a second substrate bonded to the light reception chip 201. An on-chip lens 600 is stacked on the light reception chip 201.

The light reception chip 201 is provided with a semiconductor layer 400 in which a plurality of photodiodes 221 is arranged in a matrix, and a first wiring layer 500 provided on a side opposite to the surface on which light is incident of the semiconductor layer 400.

The semiconductor layer 400 is, for example, a silicon (Si) substrate doped with a P-type impurity such as boron (B). The photodiode 221 is a region in which an N-type impurity such as phosphorus (P) is diffused, for example, in the semiconductor layer 400. A deep trench isolation (DTI) 401 that electrically and optically isolates the photodiodes 221 from each other is provided between the photodiodes 221.

The first wiring layer 500 includes, for example, an interlayer insulating film 501 such as a silicon oxide ($SiO_2$) film, multilayer wiring including first wiring M1, second wiring M2, third wiring M3 and the like provided inside the interlayer insulating film 501, and a connection electrode MCu. The connection electrode MCu is an electrode that electrically connects a light reception chip 201*x* to a detection chip 202*x* by Cu (copper)-Cu (copper) connection.

The detection chip 202 is provided with, for example, a semiconductor layer 410 in which a circuit element such as a transistor TR included in the signal processing circuit such as the address event detection circuit 300 is provided, and a second wiring layer 510 provided on a side of a surface on which light is incident of the semiconductor layer 410.

The semiconductor layer 410 is, for example, a silicon (Si) substrate doped with a P-type impurity such as boron (B). The semiconductor layer 410 is provided with a region in which the N-type impurity such as phosphorus (P) is diffused, for example. The region in which the N-type impurity is diffused becomes, for example, a source S, a drain D and the like of the transistor TR.

The second wiring layer 510 includes, for example, an interlayer insulating film 511 such as a silicon oxide ($SiO_2$) film, multilayer wiring M provided inside the interlayer insulating film 511, and the connection electrode MCu. The connection electrode MCu is the electrode that electrically connects the detection chip 202*x* to the light reception chip 201*x* by Cu (copper)-Cu (copper) connection. Furthermore, a gate electrode G of the transistor TR is provided in the second wiring layer 510.

Here, in the solid-state imaging element 200, when light 800 incident on the on-chip lens 600 is transmitted through the photodiode 221, the first wiring layer 500, and the second wiring layer 510 and is incident on the semiconductor layer 410 of the detection chip 202*x*, the detection accuracy of the change in luminance might be deteriorated.

As described above, when the light 800 is incident on, for example, the impurity diffusion regions connected to the capacitors 331 and 333 and the gate of the switch 334 in the subtractor 330, the photoelectric conversion occurs in the impurity diffusion region, and the voltage of the voltage signal input to the quantizer 340 fluctuates. Therefore, in the solid-state imaging element 200, the detection accuracy of the change in luminance is deteriorated.

Furthermore, in the solid-state imaging element 200, when light 802 by HC light emission 801 occurring in the vicinity of the gate electrode G of the transistor TR is transmitted through the second wiring layer 510 and the first wiring layer 500 and is incident on the photodiode 221, a dark current and random noise increase. Therefore, in the solid-state imaging element 200, the detection accuracy of the change in luminance is deteriorated.

Therefore, the light reception chip 201 according to the present disclosure is provided with a light shielding film 700 serving as a light shielding unit that shields light between an active element provided in the detection chip 202 and the photodiode 221 in the first wiring layer 500 provided between the semiconductor layer 400 and the detection chip 202.

According to such light reception chip 201, it is possible to prevent the light 800 incident on the on-chip lens 600 and transmitted through the photodiode 221 from being transmitted through the first wiring layer 500. Therefore, the solid-state imaging element 200 may suppress the deterioration in detection accuracy of the change in luminance due to incidence of the light 800 incident on the on-chip lens 600 on the detection chip 202.

Note that, the light reception chip 201 may be provided with wiring (hereinafter, referred to as "light shielding wiring") for shielding light in place of the light shielding film 700 at a position where the light shielding film 700 is provided. Therefore, for example, in the example illustrated in FIG. 9, transmission of the light 800 may be prevented only by changing a wiring pattern of the second wiring M2 without separately adding a step of forming the light shielding film 700.

In this case, the light shielding wiring may be connected to the first wiring M1, the second wiring M2, the third wiring M3 and the like, or may be dummy wiring that is not connected to the first wiring M1, the second wiring M2, the third wiring M3 and the like.

In contrast, the detection chip 202 is provided with light shielding wiring 701 serving as the light shielding unit that shields light between the active element provided in the detection chip 202 and the photodiode 221 in the second wiring layer 510 provided between the semiconductor layer 410 and the light reception chip 201.

According to such detection chip 202, it is possible to prevent the light 802 by the HC light emission 801 from being transmitted through the second wiring layer 510. Therefore, the solid-state imaging element 200 may suppress the deterioration in detection accuracy of the change in luminance due to incidence of the light 802 by the HC light emission 801 on the photodiode 221.

Note that, the light shielding wiring 701 may be connected to another multilayer wiring M and the like provided in the second wiring layer 510, or may be dummy wiring that is not connected to another multilayer wiring M. Furthermore, the detection chip 202 may be provided with the light shielding film in place of the light shielding wiring 701 at a position where the light shielding wiring 701 is provided.

Here, a case where the solid-state imaging element 200 is provided with the light shielding film 700 and the light shielding wiring 701 is described, but the solid-state imaging element 200 may be provided with at least any one of the light shielding film 700 or the light shielding wiring 701.

Furthermore, a case where the light shielding unit such as the light shielding film and the light shielding wiring is provided in both the light reception chip 201 and the detection chip 202 is herein described, but the light shielding unit may be provided in at least any one of the light reception chip 201 or the detection chip 202.

Figure 10A:
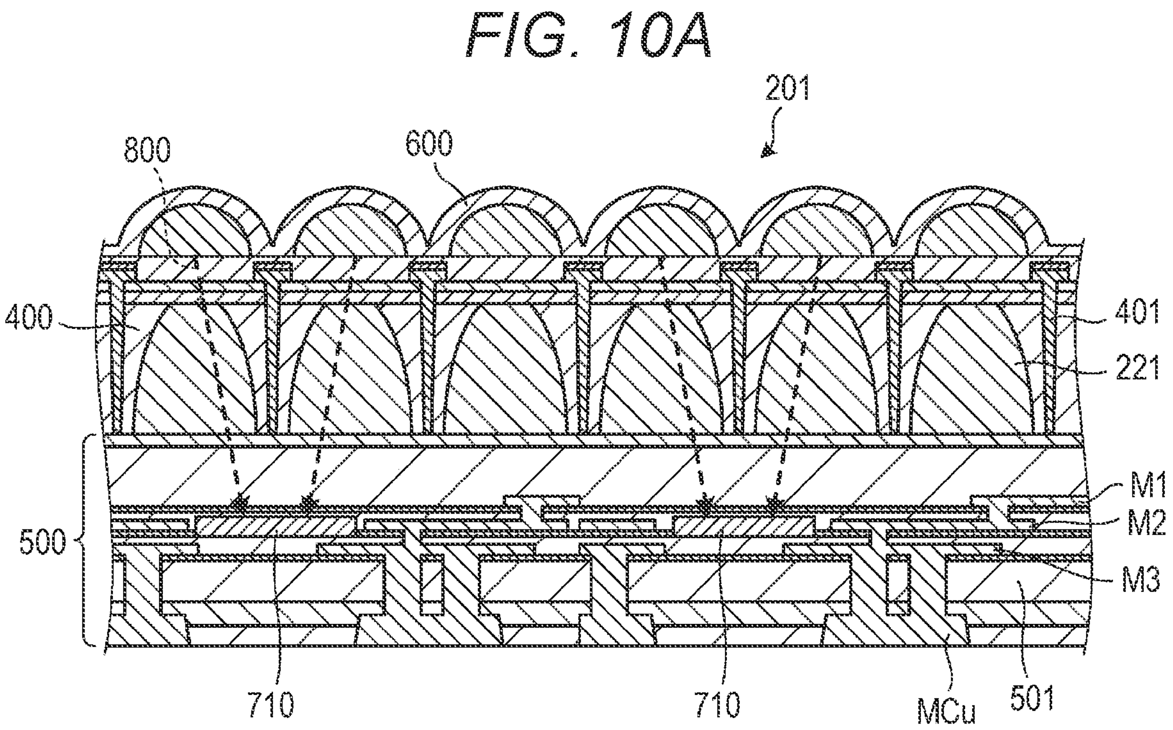
FIG. 10A is a cross-sectional illustrative view illustrating an arrangement example of a light reception chip side light shielding wiring according to the present disclosure.
Figure 10B:
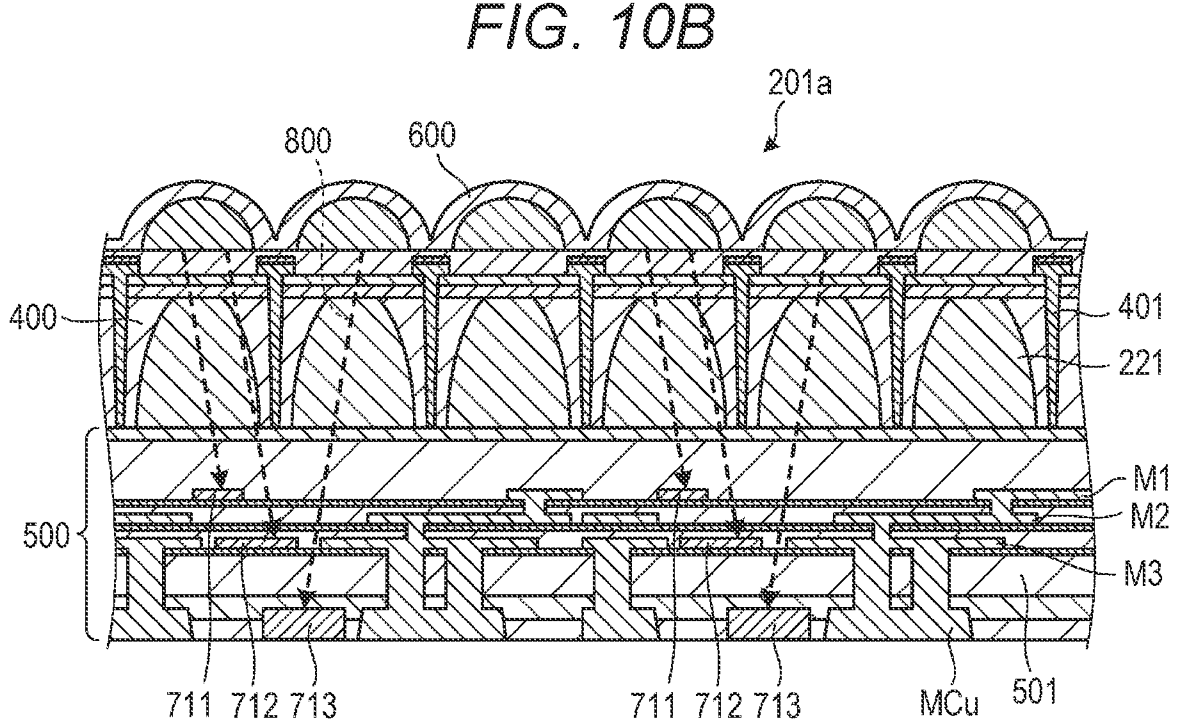
FIG. 10B is a cross-sectional illustrative view illustrating an arrangement example of a light reception chip side light shielding wiring according to the present disclosure.
Figure 10C:
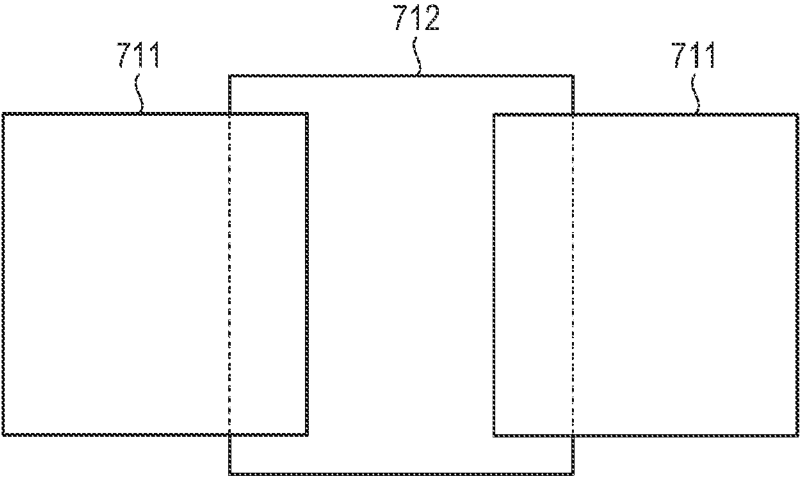
FIG. 10C is a planar illustrative view illustrating an arrangement example of a light reception chip side light shielding wiring according to the present disclosure.
Figure 10D:
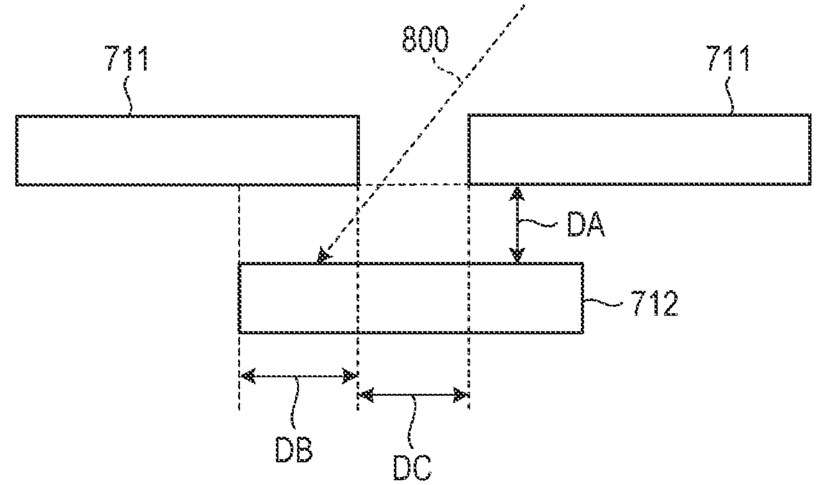
FIG. 10D is a side illustrative view illustrating an arrangement example of a light reception chip side light shielding wiring according to the present disclosure.

6-2. Arrangement Example of Light Reception Chip Side Light Shielding Wiring According to Present Disclosure Next, an arrangement example of light reception chip side light shielding wiring is described with reference to FIGS. 10A to 10D. FIGS. 10A and 10B are cross-sectional illustrative views illustrating the arrangement examples of the light reception chip side light shielding wiring according to the present disclosure. FIG. 10C is a planar illustrative view illustrating the arrangement example of the light reception chip side light shielding wiring according to the present disclosure. FIG. 10D is a side illustrative view illustrating the arrangement example of the light reception chip side light shielding wiring according to the present disclosure.

As illustrated in FIG. 10A, the light reception chip 201 has a structure in which a wiring pattern in the first wiring layer 500 is regularly repeated. In the example illustrated in FIG. 10A, the structure is such that the same wiring pattern is repeated in every three adjacent pixels.

Therefore, in the light reception chip 201, even if the light 800 incident via the on-chip lens 600 is reflected by the light shielding wiring 710, the first wiring M1, the second wiring M2, and the third wiring M3, reflected light is uniformly incident on the photodiodes 221 in units of three pixels.

Therefore, the light reception chip 201 may prevent occurrence of unevenness in received light luminance between the photodiodes 221 in units of three pixels due the reflected light by the light shielding wiring 710, the first wiring M1, the second wiring M2, and the third wiring M3.

Note that, FIG. 10A illustrates a case where the light shielding wiring 710 is provided in the same layer in the first wiring layer 500, but this is an example, and for example, as illustrated in FIG. 10B, light shielding wiring 711, light shielding wiring 712, and light shielding wiring 713 may be provided in a plurality of layers in the first wiring layer 500.

In a light reception chip 201*a* illustrated in FIG. 10B, the light shielding wiring 711 is provided in the same layer as the first wiring M1 in the first wiring layer 500, the light shielding wiring 712 is provided in the same layer as the third wiring M3, and the light shielding wiring 713 is provided in the same layer as the connection electrode MCu. A plurality of pieces of light shielding wiring 711, 712, and 713 provided in the first wiring layer 500 is provided at positions at least partially overlapping each other in plan view.

For example, as illustrated in FIG. 10C, the light shielding wiring 711 the closest to the semiconductor layer 400 is provided at a position partially overlapping both ends of the light shielding wiring 712 in a lower layer in plan view. Note that, although not herein illustrated, the light shielding wiring 712 in the lower layer is similarly provided at a position partially overlapping both ends of the light shielding wiring 713 in a further lower layer in plan view.

Therefore, in the light reception chip 201, for example, the light 800 leaking from the light shielding wiring 711 in an upper layer is shielded by the light shielding wiring 712 in the lower layer, and the light 800 leaking from the light shielding wiring 712 in the lower layer is shielded by the light shielding wiring 713 in the further lower layer, so that more reliable light shielding may be performed.

Furthermore, as illustrated in FIG. 10D, the light shielding wiring 711 on the upper layer is formed such that a width DB overlapping the light shielding wiring 712 in the lower layer is equal to or larger than a distance DA in a vertical direction from the light shielding wiring 712 in the lower layer and an interval DC from the light shielding wiring 711 provided adjacently in side view.

Furthermore, although not herein illustrated, the light shielding wiring 712 in the lower layer is similarly formed such that a width overlapping the light shielding wiring 713 in the further lower layer is equal to or larger than a distance in the vertical direction from the light shielding wiring 713 and an interval from the light shielding wiring 712 provided adjacently in side view. Therefore, the light reception chip 201 may more reliably shield the light 800 incident in an oblique direction.

Figure 11A:
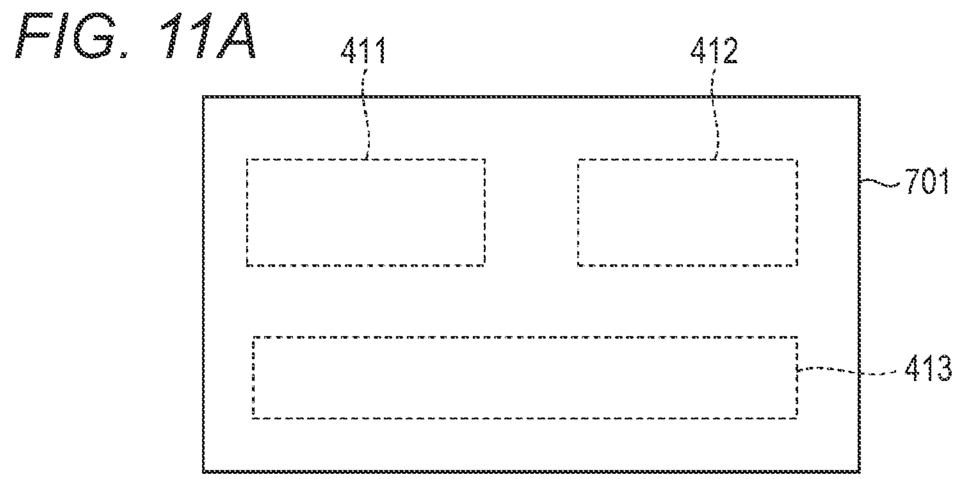
FIG. 11A is a planar illustrative view illustrating an arrangement example of a detection chip side light shielding wiring according to the present disclosure.
Figure 11B:
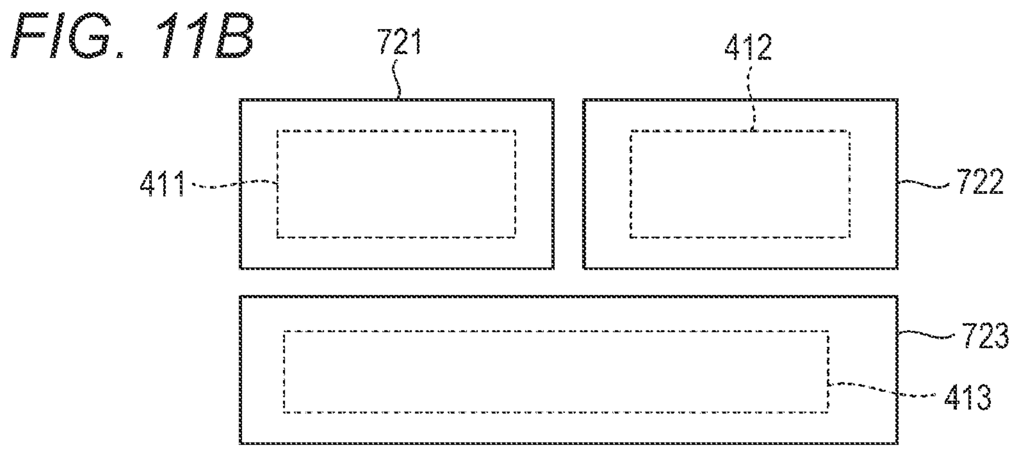
FIG. 11B is a planar illustrative view illustrating an arrangement example of a detection chip side light shielding wiring according to the present disclosure.
Figure 11C:
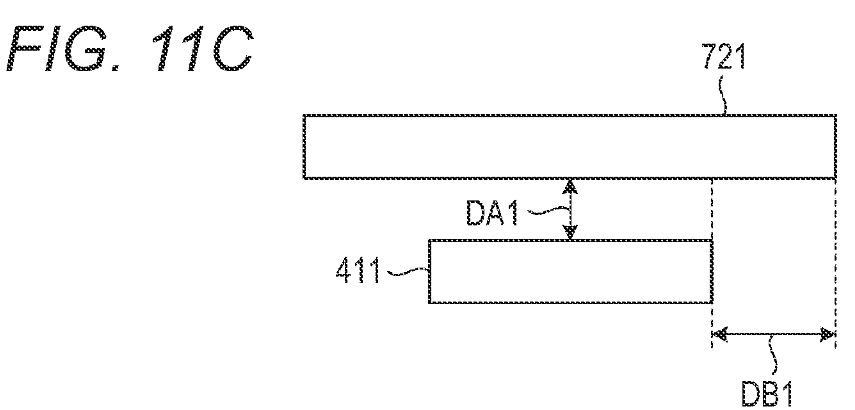
FIG. 11C is a side illustrative view illustrating an arrangement example of a detection chip side light shielding wiring according to the present disclosure.

6-3. Arrangement Example of Detection Chip Side Light Shielding Wiring According to Present Disclosure Next, an arrangement example of detection chip side light shielding wiring is described with reference to FIGS. 11A and 11B. FIGS. 11A and 11B are planar illustrative views illustrating the arrangement examples of the detection chip side light shielding wiring according to the present disclosure. FIG. 11C is a side illustrative view illustrating the arrangement example of the detection chip side light shielding wiring according to the present disclosure.

As illustrated in FIG. 11A, the light shielding wiring 701 provided in the detection chip 202 is provided at a position overlapping circuit blocks 411, 412, and 413 including the active element in which the HC light emission 801 occurs such as the transistor TR, for example. Then, the light shielding wiring 701 has a size that encloses the circuit block 411, 412, and 413 in plan view.

That is, the light shielding wiring 701 covers the circuit blocks 411, 412, and 413 with a coverage of 100% or more. Note that, the circuit blocks 411, 412, and 413 may be the active element itself in which the HC light emission 801 occurs, or may be a region including a plurality of impurity diffusion regions. Therefore, the light shielding wiring 701 may prevent the light 802 by the HC light emission 801 occurring in the detection chip 202 from being incident on the photodiode 221.

Furthermore, as illustrated in FIG. 11B, in the second wiring layer 510 of the detection chip 202, light shielding wiring 721, light shielding wiring 722, and light shielding wiring 723 may be provided for the circuit blocks 411, 412, and 413, respectively. In this case, as illustrated in FIG. 11C, for example, the light shielding wiring 721 is formed such that a protrusion width DB1 from an outer periphery of the circuit block 411 in side view is equal to or larger than a distance DA1 in the vertical direction from the circuit block 411 in side view.

Furthermore, the light shielding wiring 722 and the light shielding wiring 723 are similarly formed such that the protrusion width from the outer periphery in side view of the corresponding circuit blocks 412 and 413 is equal to or larger than the distance from the circuit blocks 412 and 413 in the vertical direction.

Furthermore, in the example illustrated in FIG. 11A, the light shielding wiring 701 is formed such that the protrusion width from the outer periphery of the region including the circuit blocks 411, 412, and 413 in side view is equal to or larger than the distance from the circuit blocks 11, 412, and 413 in the vertical direction in side view.

Therefore, the light shielding wiring 701, the light shielding wiring 721, and the light shielding wiring 722 may prevent the light 802 from being incident on the photodiode 221 even when the light 802 by the HC light emission 801 is radially diffused.

Note that, a case where the light shielding wiring 701, the light shielding wiring 721, and the light shielding wiring 722 in one layer are provided in the second wiring layer 510 of the detection chip 202 is herein described, but this is an example. In the second wiring layer 510, similarly to the first wiring layer 500 illustrated in FIG. 11B, the light shielding wiring 711, the light shielding wiring 712, and the light shielding wiring 713 may be provided in a plurality of layers.

Figure 12:
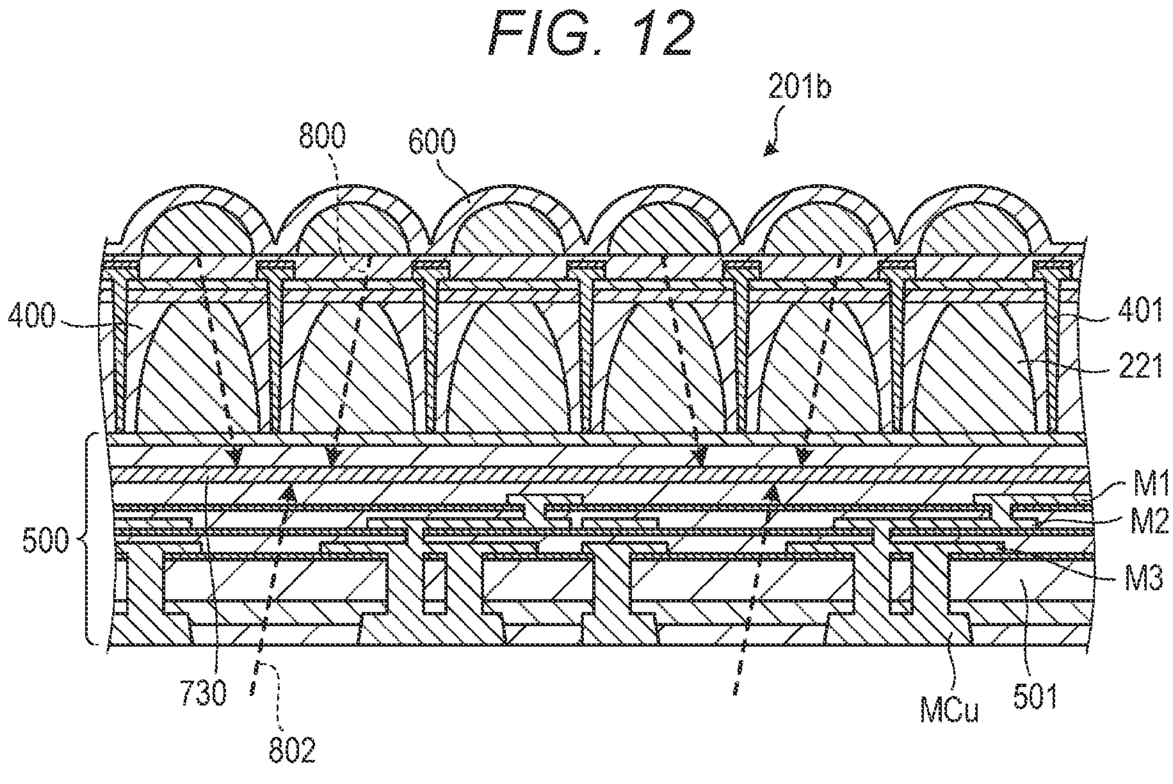
FIG. 12 is a cross-sectional illustrative view illustrating another arrangement example of a light shielding film according to the present disclosure.

6-4. Another Arrangement Example of Light Shielding Film According to Present Disclosure Next, another arrangement example of the light shielding film according to the present disclosure is described with reference to FIG. 12. FIG. 12 is a cross-sectional illustrative view illustrating another arrangement example of the light shielding film according to the present disclosure.

As illustrated in FIG. 12, a light reception chip 201*b* is provided with a light shielding film 730 solidly placed on an entire region overlapping a light reception region in which a plurality of photodiodes 221 is arranged in plan view in the first wiring layer 500. Note that, the light shielding film 730 is provided with an opening for connecting the photodiode 221 to a read electrode of the photocurrent outside the light reception region.

Therefore, the light reception chip 201*b* may more reliably prevent the light 800 transmitted through the photodiode 221 and the light 802 by the HC light emission 801 from being transmitted through the first wiring layer 500.

Furthermore, the light shielding film 730 is provided between the first wiring M1 the closest to the semiconductor layer 400 among the multilayer wiring provided in the first wiring layer 500 and the semiconductor layer 400. Therefore, in the light reception chip 201*b*, a distance between the light shielding film 730 and the photodiode 221 is further shortened, so that even when the light 800 transmitted through the photodiode 221 is reflected by the light shielding film 730, it is possible to suppress the light from being incident on the adjacent photodiode. That is, according to the light reception chip 201*b*, a crosstalk of the reflected light by the light shielding film 730 may be reduced.

6-5. Light Shielding Trench Structure According to Present Disclosure

Figure 13:
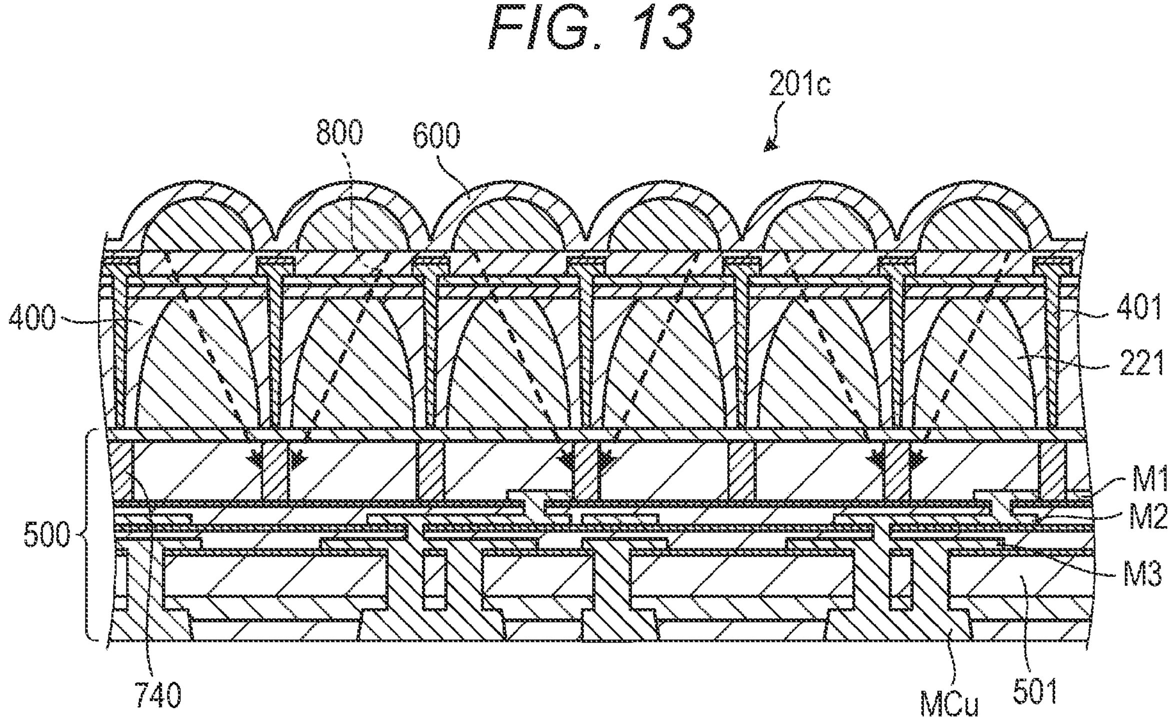
FIG. 13 is a cross-sectional illustrative view illustrating a light shielding trench structure according to the present disclosure.

Next, a light shielding trench structure according to the present disclosure is described with reference to FIG. 13. FIG. 13 is a cross-sectional illustrative view illustrating the light shielding trench structure according to the present disclosure.

As illustrated in FIG. 13, a light reception chip 201*c* is provided with a light shielding member 740 embedded in a trench extending from a boundary region between the adjacent photodiodes 221 toward the inside of the first wiring layer 500. Therefore, in the light reception chip 201*c*, the light 800 incident on the photodiode 221 in an oblique direction may be shielded by the light shielding member 740.

Note that, by providing the light shielding member 740 in addition to the configuration of the other light reception chips 201, 201*a*, and 201*b* described above, light shielding performance of the light reception chips 201, 201*a*, and 201*b* may be further improved, and the crosstalk of the reflected light may be reduced.

6-6. First Light Shielding Structure Example According to Present Disclosure

Figure 14A:
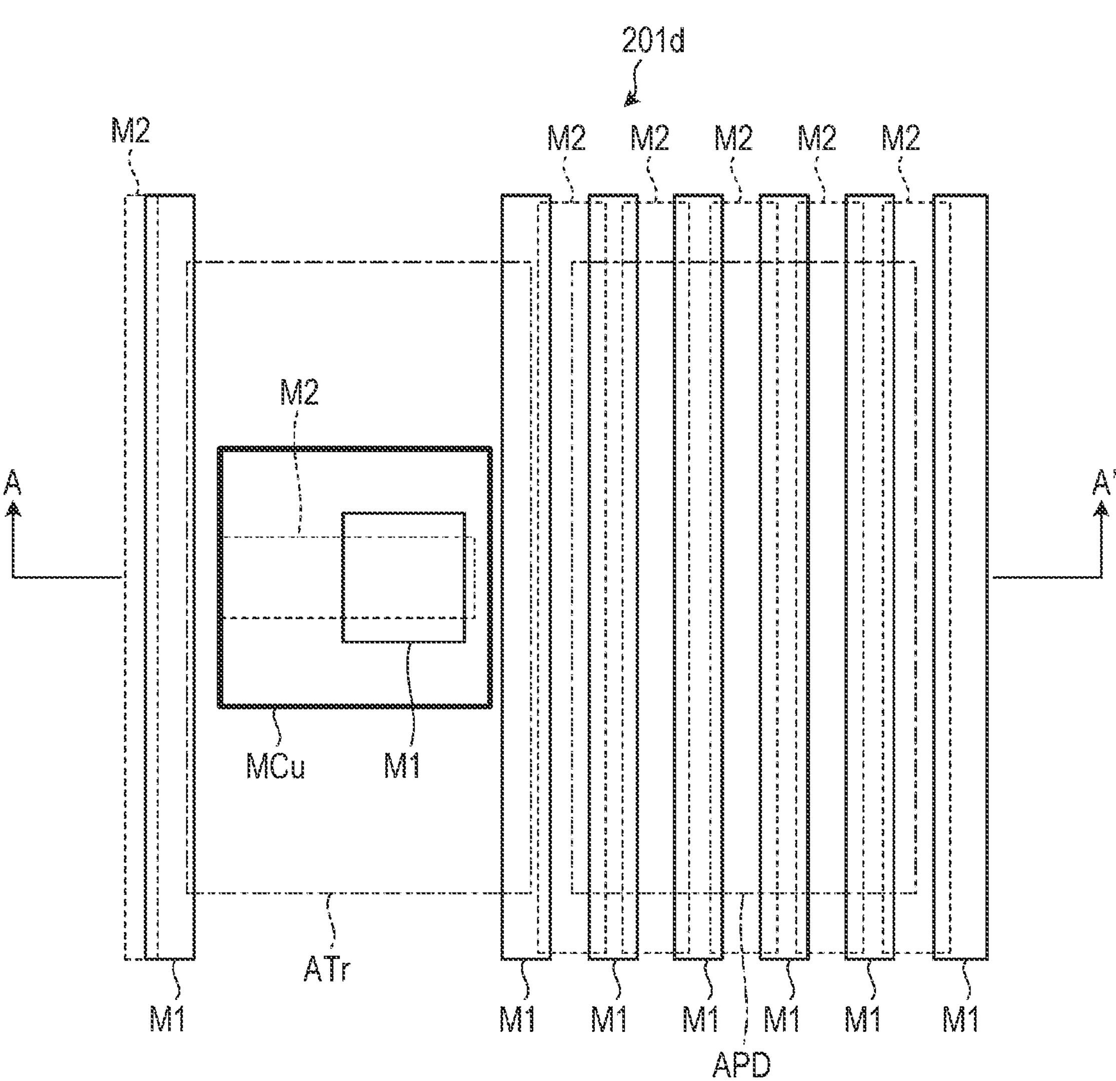
FIG. 14A is a planar illustrative view illustrating a first light shielding structure example according to the present disclosure.
Figure 14B:
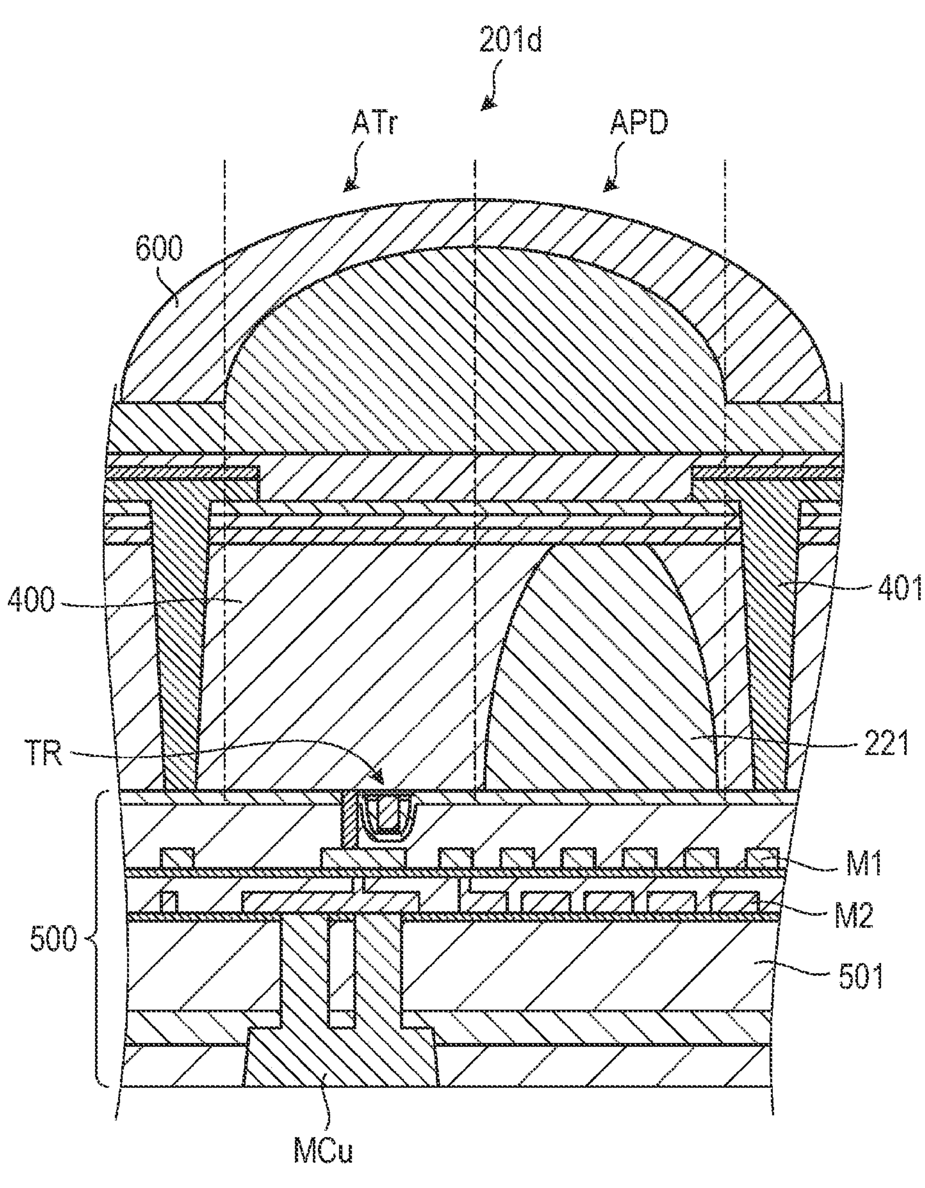
FIG. 14B is a cross-sectional illustrative view taken along line A-A' in FIG. 15A.

Next, a first light shielding structure example is described with reference to FIGS. 14A and 14B. FIG. 14A is a planar illustrative view illustrating the first light shielding structure example according to the present disclosure. FIG. 14B is a cross-sectional illustrative view taken along line A-A' in FIG. 14A. Note that, FIGS. 14A and 14B illustrate a portion corresponding to one pixel in a light reception chip 201*d*.

As illustrated in FIGS. 14A and 14B, the light reception chip 201*d* includes a photodiode region APD requiring light shielding and a pixel transistor region ATr not requiring light shielding. Therefore, in the photodiode region APD, a plurality of pieces of parallel first wiring M1 in a band shape extending in a plane direction of the first wiring layer 500 is provided in a stripe shape at equal intervals in a lower layer of the photodiode 221. Moreover, in a lower layer of the first wiring M1, a plurality of pieces of parallel second wiring M2 in a band shape is provided at equal intervals in a stripe shape parallel to the first wiring.

The first wiring M1 and the second wiring M2 are alternately arranged in plan view, and are provided such that an end in a lateral direction of the second wiring M2 is covered with an end in the lateral direction of the first wiring M1 in plan view. Therefore, the light reception chip 201*d* may shield light between the photodiode 221 and the detection chip 202 by the first wiring M1 and the second wiring M2.

6-7. Second Light Shielding Structure Example According to Present Disclosure

Figure 15A:
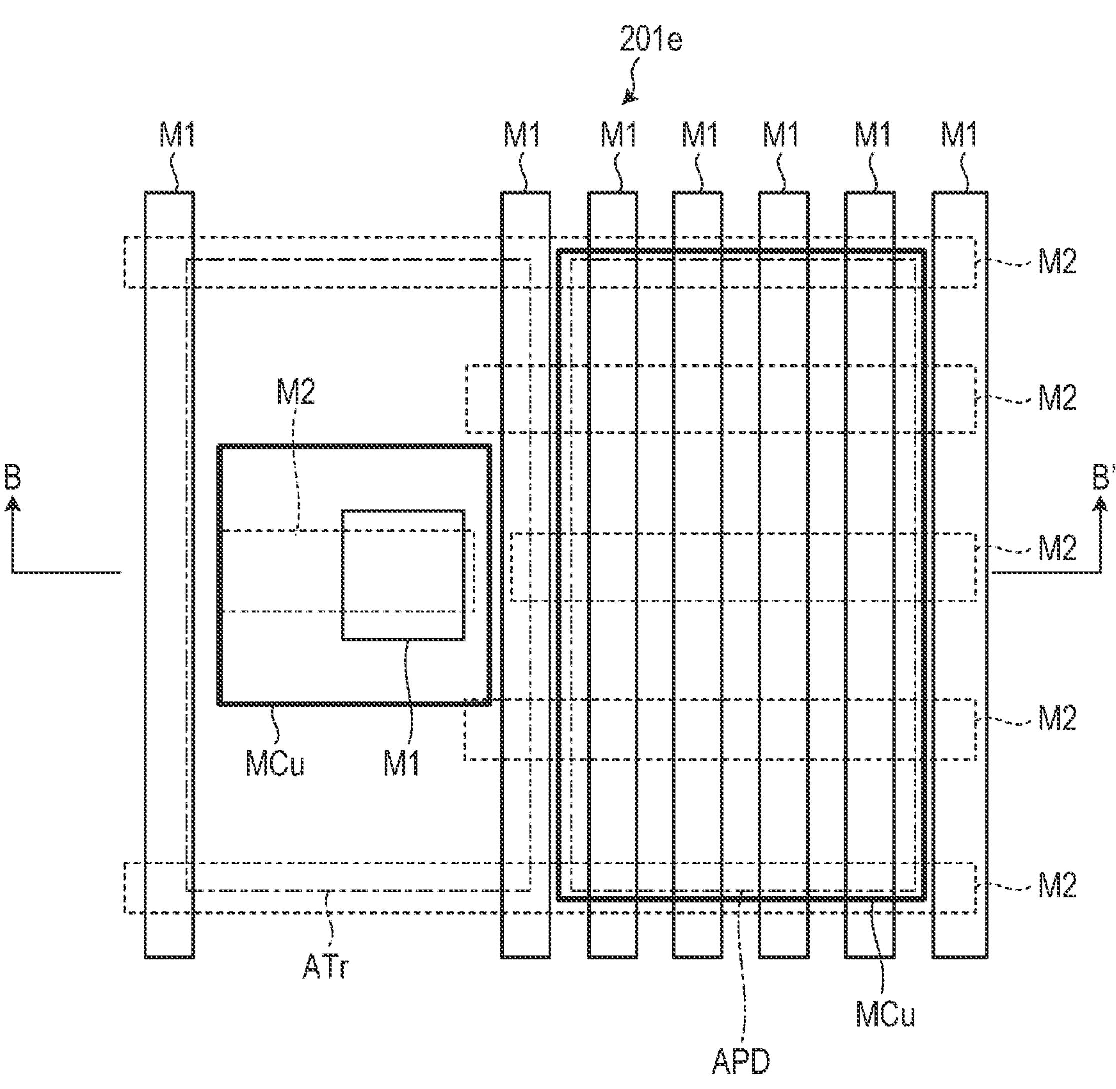
FIG. 15A is a planar illustrative view illustrating a second light shielding structure example according to the present disclosure.
Figure 15B:
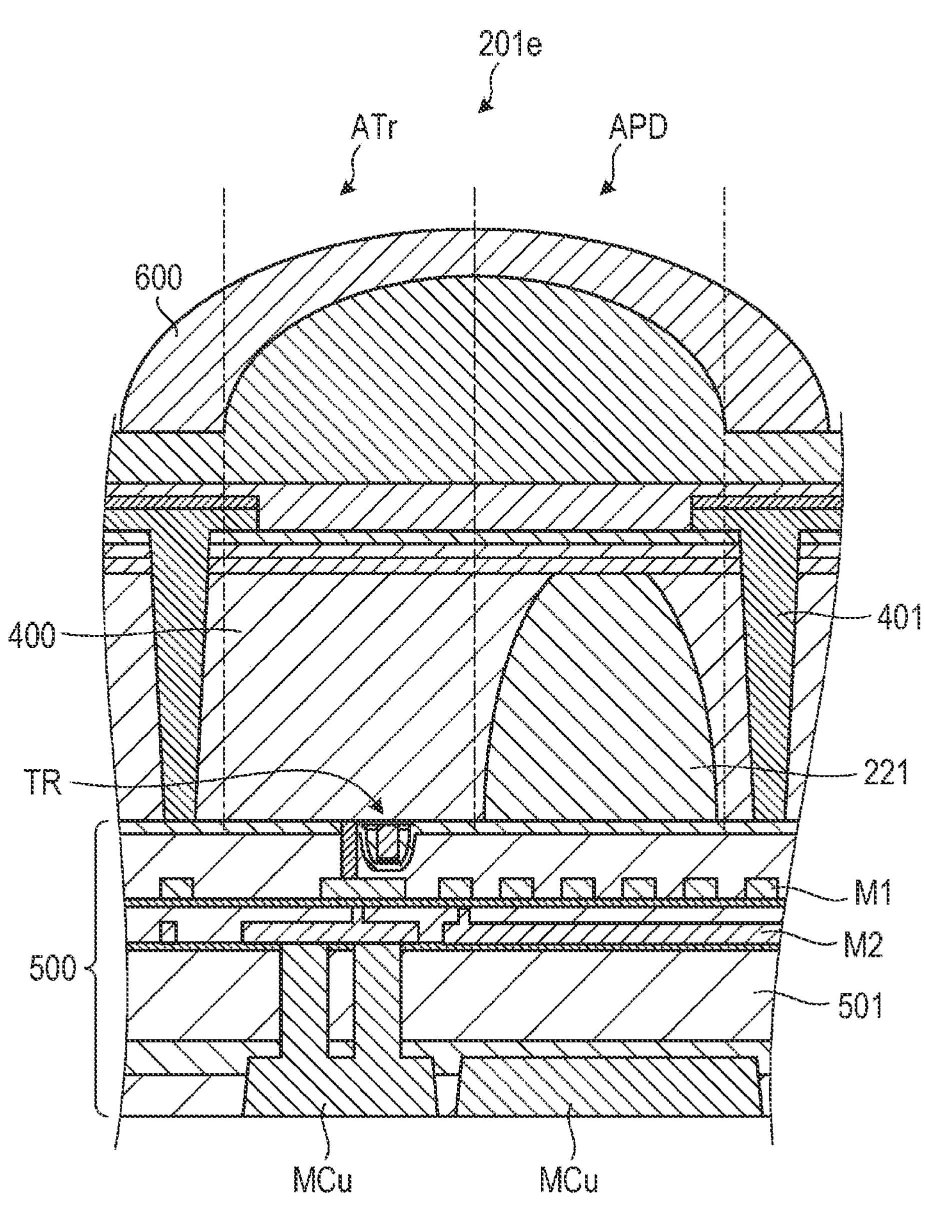
FIG. 15B is a cross-sectional illustrative view taken along line B-B' in FIG. 16A.

Next, a second light shielding structure example is described with reference to FIGS. 15A and 15B. FIG. 15A is a planar illustrative view illustrating the second light shielding structure example according to the present disclosure. FIG. 15B is a cross-sectional illustrative view taken along line B-B' in FIG. 15A. Note that, FIGS. 15A and 15B illustrate a portion corresponding to one pixel in the light reception chip 201*d*.

As illustrated in FIGS. 15A and 15B, the light reception chip 201*e* also includes a photodiode region APD requiring light shielding and a pixel transistor region ATr not requiring light shielding. Therefore, in the photodiode region APD, a plurality of pieces of parallel first wiring M1 in a band shape extending in a plane direction of the first wiring layer 500 is provided in a stripe shape at equal intervals in a lower layer of the photodiode 221.

Then, in a lower layer of the first wiring M1, a plurality of pieces of parallel second wiring M2 in a band shape is provided at equal intervals in a stripe shape orthogonal to the first wiring. That is, the first wiring M1 and the second wiring M2 are provided in a lattice manner in plan view. Moreover, in a lower layer of the second wiring M2, the connection electrode MCu is provided in a region overlapping the photodiode 221 in plan view.

Therefore, the light reception chip 201*e* may shield light between the photodiode 221 and the detection chip 202 by the first wiring M1, the second wiring M2, and the connection electrode MCu.

7. Another Configuration Example of Address Event Detection Circuit

Figure 16:
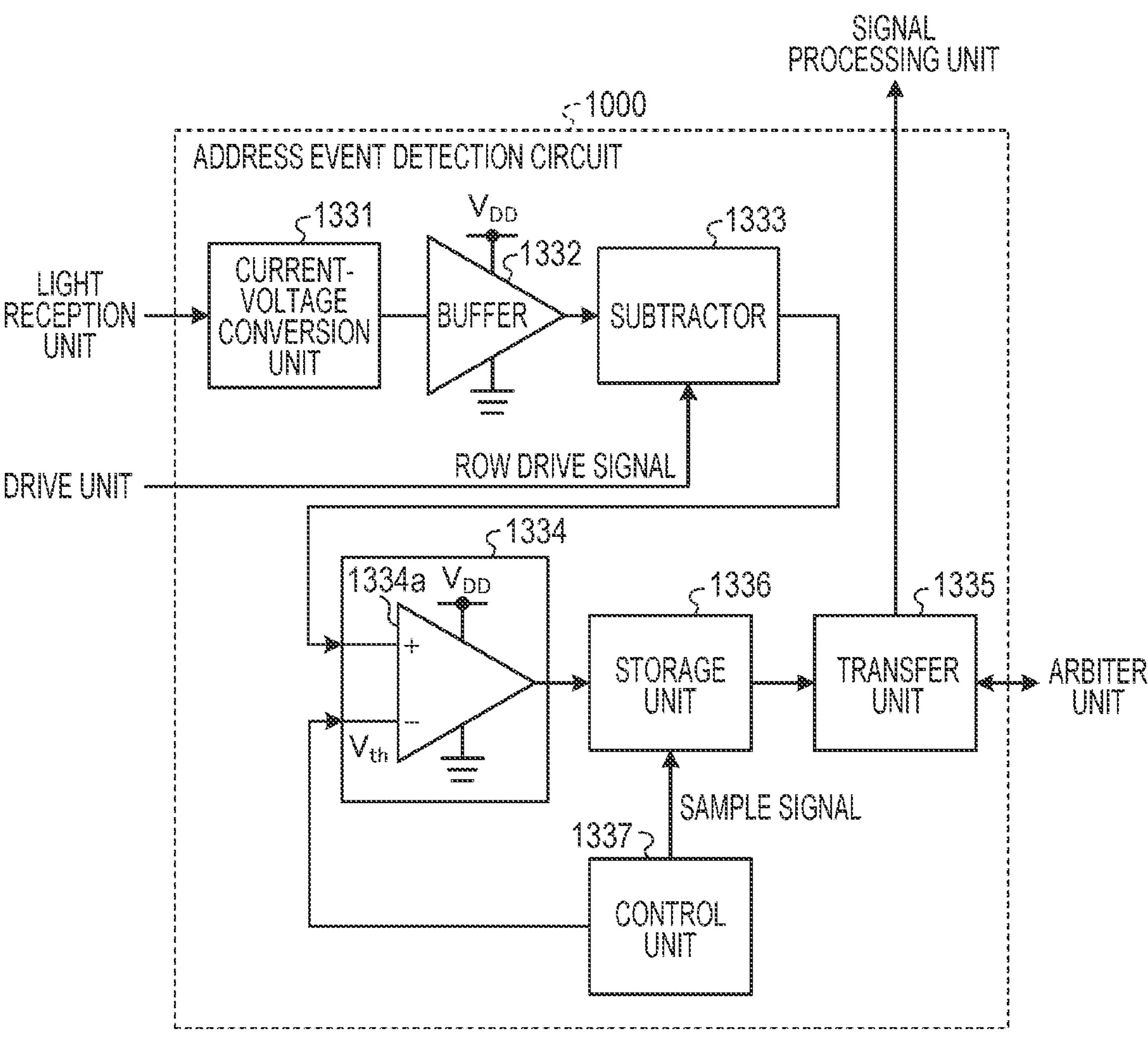
FIG. 16 is a block diagram illustrating another configuration example of the address event detection circuit according to the present disclosure.

FIG. 16 is a block diagram illustrating a second configuration example of an address event detection circuit 1000. As illustrated in FIG. 16, the address event detection circuit 1000 according to this configuration example includes a storage unit 1336 and a control unit 1337 in addition to a current-voltage conversion unit 1331, a buffer 1332, a subtractor 1333, a quantizer 1334, and a transfer unit 1335.

The storage unit 1336 is provided between the quantizer 1334 and the transfer unit 1335, and accumulates an output of the quantizer 1334, that is, a comparison result of a comparator 1334*a* on the basis of a sample signal supplied from the control unit 1337. The storage unit 1336 may be a sampling circuit such as a switch, plastic, or capacitance, or may be a digital memory circuit such as a latch or a flip-flop.

The control unit 1337 supplies a predetermined threshold voltage Vth to an inverting (−) input terminal of the comparator 1334*a*. The threshold voltage Vth supplied from the control unit 1337 to the comparator 1334*a* may have different voltage values in a time division manner. For example, the control unit 1337 supplies a threshold voltage Vth1 corresponding to an on event indicating that an amount of change in photocurrent exceeds an upper limit threshold and a threshold voltage Vth2 corresponding to an off event indicating that the change amount falls below a lower limit threshold at different timings, so that one comparator 1334*a* may detect a plurality of types of address events.

For example, the storage unit 1336 may accumulate the comparison result of the comparator 1334*a* using the threshold voltage Vth1 corresponding to the on event in a period in which the threshold voltage Vth2 corresponding to the off event is supplied from the control unit 1337 to the inverting (−) input terminal of the comparator 1334*a*. Note that, the storage unit 1336 may be located inside a pixel 2030 (refer to FIG. 17) or outside the pixel 2030. Furthermore, the storage unit 1336 is not an essential component of the address event detection circuit 1000. That is, the storage unit 1336 may be omitted.

8. Configuration Example of Scan Type Imaging Device According to Present Disclosure The imaging device 100 described above is an asynchronous imaging device that reads the event by an asynchronous reading method. Note that, an event reading method is not limited to the asynchronous reading method, and may be a synchronous reading method. The imaging device to which the synchronous reading method is applied is a scan type imaging device, the same as a normal imaging device that performs imaging at a predetermined frame rate.

Figure 17:
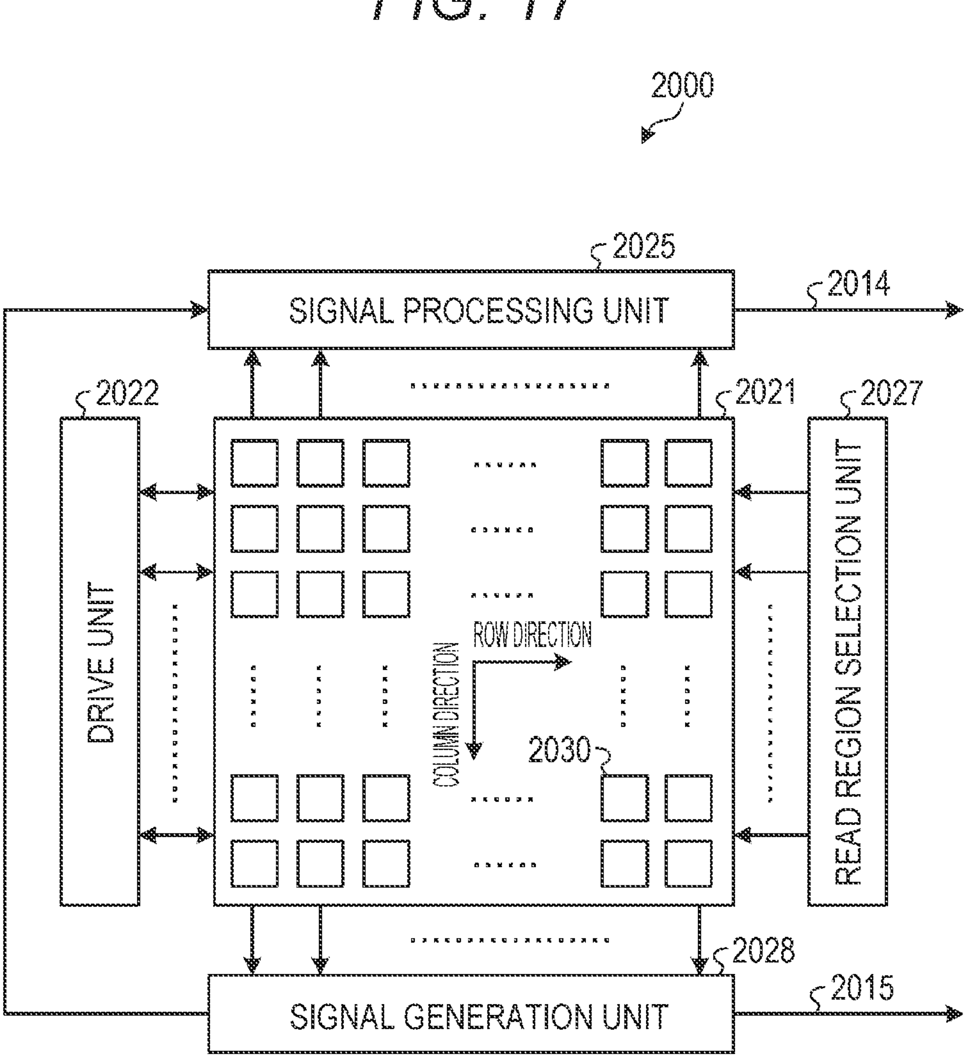
FIG. 17 is a block diagram illustrating a configuration example of a scan type imaging device according to the present disclosure.

FIG. 17 is a block diagram illustrating a configuration example of the scan type imaging device according to the present disclosure. As illustrated in FIG. 17, the imaging device 2000 according to the present disclosure is provided with a pixel array unit 2021, a drive unit 2022, a signal processing unit 2025, a read region selection unit 2027, and a signal generation unit 2028.

The pixel array unit 2021 includes a plurality of pixels 2030. The plurality of pixels 2030 outputs an output signal in response to a selection signal of the read region selection unit 2027. Each of the plurality of pixels 2030 may have a quantizer comparator in the pixel. The plurality of pixels 2030 outputs the output signal corresponding to a change amount of intensity of light. The plurality of pixels 2030 may be two-dimensionally arranged in a matrix as illustrated in FIG. 17.

The drive unit 2022 drives each of the plurality of pixels 2030 to output a pixel signal generated in each pixel 2030 to the signal processing unit 2025. Note that, the drive unit 2022 and the signal processing unit 2025 are circuit units for acquiring gradation information. Therefore, in a case where only event information is acquired, the drive unit 2022 and the signal processing unit 2025 may be omitted.

The read region selection unit 2027 selects some of the plurality of pixels 2030 included in the pixel array unit 2021. Specifically, the read region selection unit 2027 determines a selected region in response to a request from each pixel 2030 of the pixel array unit 2021. For example, the read region selection unit 2027 selects any one or a plurality of rows among rows included in a structure of a two-dimensional matrix corresponding to the pixel array unit 2021. The read region selection unit 2027 sequentially selects one or a plurality of rows according to a cycle set in advance. Furthermore, the read region selection unit 2027 may determine the selected region in response to the request from each pixel 2030 of the pixel array unit 2021.

On the basis of the output signal of the pixel selected by the read region selection unit 2027, the signal generation unit 2028 generates an event signal corresponding to an active pixel in which the event is detected among the selected pixels. The event is the event in which the intensity of light changes. The active pixel is the pixel in which the change amount of the intensity of light corresponding to the output signal exceeds or falls below a threshold set in advance. For example, the signal generation unit 2028 compares the output signal of the pixel with a reference signal, detects the active pixel that outputs the output signal in a case where this is larger or smaller than the reference signal, and generates the event signal corresponding to the active pixel.

The signal generation unit 2028 may include a column selection circuit that arbitrates a signal entering the signal generation unit 2028, for example. Furthermore, the signal generation unit 2028 may be configured to output not only the information of the active pixel in which the event is detected but also the information of an inactive pixel in which the event is not detected.

The address information and time stamp information (for example, (X,Y,T)) of the active pixel in which the event is detected are output from the signal generation unit 2028 through an output line 2015. Note that, the data output from the signal generation unit 2028 may be not only the address information and the time stamp information but also information in a frame format (for example, (0,0,1,0, . . . ).

9. Distance Measuring System

A distance measuring system according to the embodiment of the present disclosure is the system for measuring a distance to a subject using a structured light method technology. Furthermore, the distance measuring system according to the embodiment of the present disclosure may also be used as a system for acquiring a three-dimensional (3D) image, and in this case, this may be referred to as a three-dimensional image acquisition system. In the structured light method, distance measurement is performed by identifying coordinates of a point image and a light source (a so-called point light source) from which the point image is projected by pattern matching.

Figure 18:
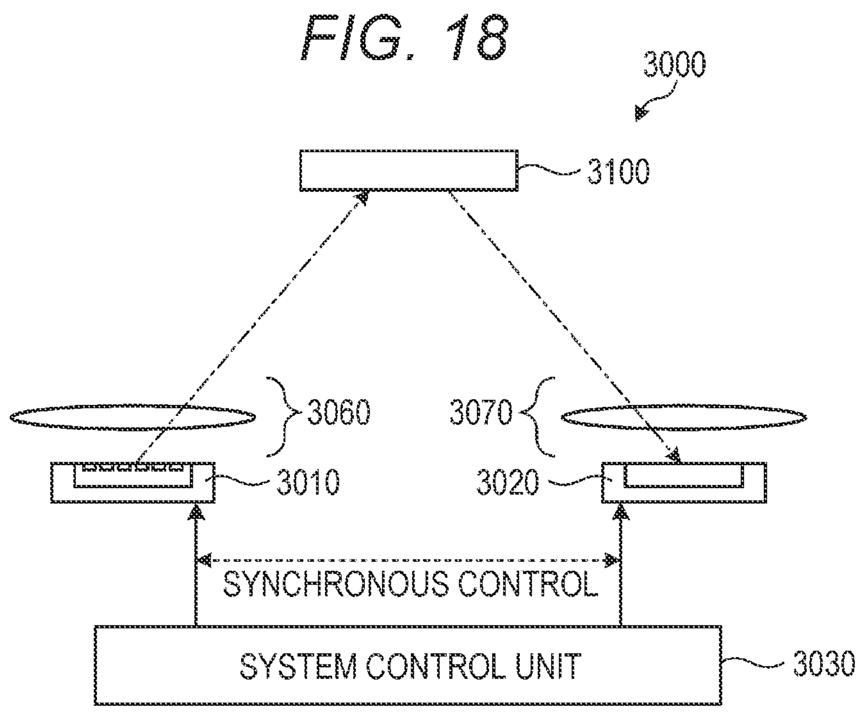
FIG. 18 is a schematic diagram illustrating a configuration example of a distance measuring system according to an embodiment of the present disclosure.
Figure 19:
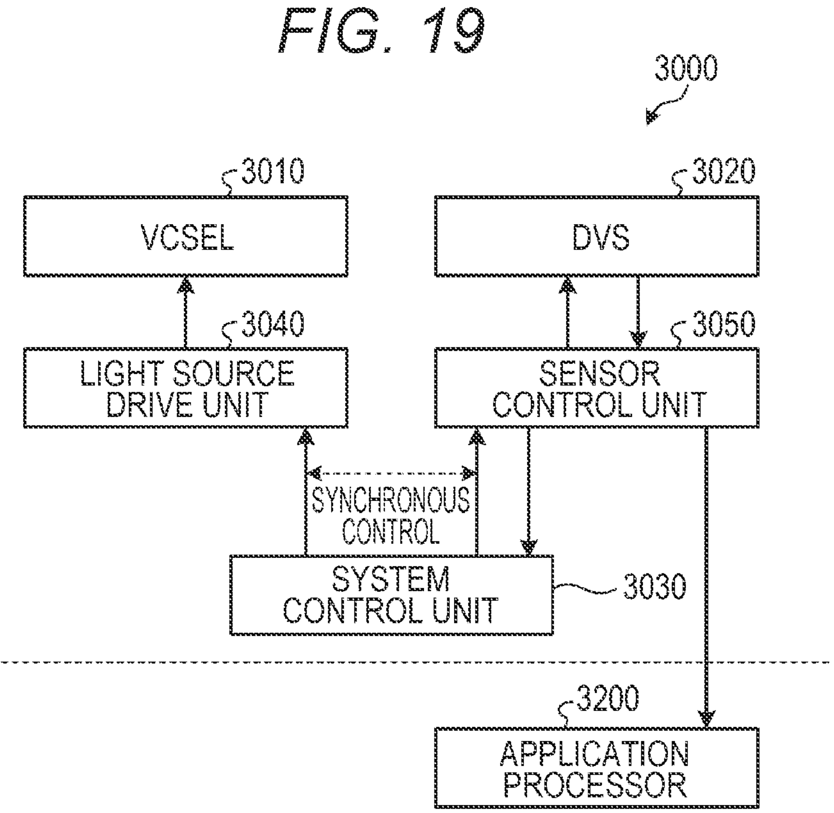
FIG. 19 is a block diagram illustrating a circuit configuration example of the distance measuring system according to the embodiment of the present disclosure.

FIG. 18 is a schematic diagram illustrating an example of a configuration of the distance measuring system according to the embodiment of the present disclosure, and FIG. 19 is a block diagram illustrating an example of a circuit configuration.

A distance measuring system 3000 according to this embodiment uses a surface emitting semiconductor laser, for example, a vertical cavity surface emitting laser (VCSEL) 3010 as a light source unit, and uses an event detection sensor 3020 referred to as DVS as a light reception unit. The vertical cavity surface emitting laser (VCSEL) 3010 projects predetermined pattern of light onto the subject. The distance measuring system 3000 according to this embodiment is provided with a system control unit 3030, a light source drive unit 3040, a sensor control unit 3050, a light source side optical system 3060, and a camera side optical system 3070 in addition to the vertical cavity surface emitting laser 3010 and the event detection sensor 3020.

The system control unit 3030 includes, for example, a processor (CPU), drives the vertical cavity surface emitting laser 3010 via the light source drive unit 3040, and drives the event detection sensor 3020 via the sensor control unit 3050. More specifically, the system control unit 3030 synchronously controls the vertical cavity surface emitting laser 3010 and the event detection sensor 3020.

In the distance measuring system 3000 according to this embodiment having the above-described configuration, the light of a predetermined pattern emitted from the vertical cavity surface emitting laser 3010 is projected to a subject (measurement target) 3100 through the light source side optical system 3060. This projected light is reflected by the subject 3100. Then, the light reflected by the subject 3100 is incident on the event detection sensor 3020 through the camera side optical system 3070. The event detection sensor 3020 receives the light reflected by the subject 3100, and detects that a change in luminance of the pixel exceeds a predetermined threshold as an event. Event information detected by the event detection sensor 3020 is supplied to an application processor 3200 outside the distance measuring system 3000. The application processor 3200 performs predetermined processing on the event information detected by the event detection sensor 3020.

10. Effect

A solid-state imaging element according to the present disclosure is provided with a first substrate and a second substrate. The first substrate is provided with a photodiode that photoelectrically converts incident light to generate a photocurrent. The second substrate is provided with the luminance change detection circuit that detects the change in luminance of the incident light on the basis of the voltage signal converted by the conversion circuit that converts the photocurrent into the voltage signal, and is bonded to the first substrate. The light shielding unit that is provided in at least any one of the first substrate or the second substrate and shields light between the active element provided in the second substrate and the photodiode is included. Therefore, the solid-state imaging element may suppress the deterioration in detection accuracy of the change in luminance by shielding light between the first substrate and the second substrate by the light shielding unit.

Furthermore, the light shielding unit is the light shielding film provided in the first wiring layer provided between the semiconductor layer including the photodiode in the first substrate and the second substrate. Therefore, the solid-state imaging element may suppress the deterioration in detection accuracy of the change in luminance by shielding light between the first substrate and the second substrate by the light shielding film.

Furthermore, the light shielding film is provided in the region overlapping the light reception region in which a plurality of photodiodes is arranged in plan view. Therefore, in the solid-state imaging element, by shielding light between the first substrate and the second substrate by the light shielding film provided in an entire region overlapping the light reception region in plan view, it is possible to suppress the deterioration in detection accuracy of the change in luminance.

Furthermore, the light shielding film is provided between the wiring the closest to the semiconductor layer among the multilayer wiring provided in the first wiring layer and the semiconductor layer. The crosstalk of the reflected light by the light shielding film may be reduced.

Furthermore, the light shielding unit is the light shielding wiring provided in the first wiring layer provided between the semiconductor layer including the photodiode in the first substrate and the second substrate. Therefore, the solid-state imaging element may prevent transmission of the light only by changing the wiring pattern of the wiring provided in the first wiring layer without separately adding the step of forming the light shielding film.

Furthermore, the light shielding wiring provided in the first wiring layer includes a plurality of layers of wiring at least partially overlapping in plan view. Therefore, the solid-state imaging element may more reliably prevent light transmission than single-layer light shielding wiring.

Furthermore, the light shielding unit is the light shielding wiring provided in the second wiring layer provided between the semiconductor layer including the active element in the second substrate and the first substrate. Therefore, the solid-state imaging element may prevent the light of the HC light emission occurring in the active element from being incident on the photodiode.

Furthermore, the light shielding wiring provided in the second wiring layer includes a plurality of layers of wiring at least partially overlapping in plan view. Therefore, the solid-state imaging element may more reliably prevent light transmission than single-layer light shielding wiring.

Furthermore, the light shielding unit is the connection electrode that electrically connects the first substrate to the second substrate. Therefore, the solid-state imaging element may prevent transmission of the light, for example, only by changing a wiring pattern of the existing connection electrode that performs Cu—Cu connection without separately adding a step of forming the light shielding film.

Furthermore, the solid-state imaging element includes the light shielding member embedded in the trench extending from the boundary region between adjacent photodiodes toward the inside of the first wiring layer provided between the semiconductor layer including the photodiode in the first substrate and the second substrate. Therefore, in the solid-state imaging element, the light incident in an oblique direction may be shielded by the light shielding member.

Furthermore, the imaging system includes the solid-state imaging element and the signal processing chip. The solid-state imaging element is provided with the lens, the first substrate, and the second substrate. The first substrate is provided with a photodiode that photoelectrically converts incident light to generate a photocurrent. The second substrate is provided with the luminance change detection circuit that detects the change in luminance of the incident light on the basis of the voltage signal converted by the conversion circuit that converts the photocurrent into the voltage signal, and is bonded to the first substrate. The solid-state imaging element includes the light shielding unit. The light shielding unit is provided in at least any one of the first substrate or the second substrate and shields light between the active element provided in the second substrate and the photodiode. The signal processing chip performs signal processing on an output from the solid-state imaging element. Therefore, the imaging system may suppress the deterioration in detection accuracy of the change in luminance by shielding light between the first substrate and the second substrate by the light shielding unit.

Note that, the effect described in this specification is illustrative only; the effect is not limited thereto and there may also be another effect.

Note that, the present technology may also have following configurations.

(1)

A solid-state imaging element provided with:

a first substrate provided with a photodiode that photoelectrically converts incident light to generate a photocurrent; and a second substrate provided with a luminance change detection circuit that detects a change in luminance of the incident light on the basis of a voltage signal converted by a conversion circuit that converts the photocurrent into the voltage signal, the second substrate bonded to the first substrate, the solid-state imaging element including:

a light shielding unit that is provided in at least any one of the first substrate or the second substrate and shields light between an active element provided in the second substrate and the photodiode.

(2)

The solid-state imaging element according to (1) above, in which the light shielding unit includes:

a light shielding film provided in a first wiring layer provided between a semiconductor layer including the photodiode in the first substrate and the second substrate.

(3)

The solid-state imaging element according to (2) above, in which the light shielding film is provided in a region overlapping a light reception region in which a plurality of photodiodes is arranged in plan view.

(4)

The solid-state imaging element according to (2) or (3) above, in which the light shielding film is provided between wiring the closest to the semiconductor layer among multilayer wiring provided in the first wiring layer and the semiconductor layer.

(5)

The solid-state imaging element according to any one of (1) to (4) above, in which the light shielding unit includes:

light shielding wiring provided in a first wiring layer provided between a semiconductor layer including the photodiode in the first substrate and the second substrate.

(6)

The solid-state imaging element according to (5) above, in which the light shielding wiring provided in the first wiring layer includes a plurality of layers of wiring at least partially overlapping in plan view.

(7)

The solid-state imaging element according to any one of (1) to (6) above, in which the light shielding unit includes:

light shielding wiring provided in a second wiring layer provided between a semiconductor layer including the active element in the second substrate and the first substrate.

(8)

The solid-state imaging element according to (7) above, in which the light shielding wiring provided in the second wiring layer includes a plurality of layers of wiring at least partially overlapping in plan view.

(9)

The solid-state imaging element according to any one of (1) to (8) above, in which the light shielding unit includes a connection electrode that electrically connects the first substrate to the second substrate.

(10)

The solid-state imaging element according to any one of (1) to (9) above, further provided with:

a light shielding member embedded in a trench extending from a boundary region between adjacent photodiodes toward an inside of a first wiring layer provided between a semiconductor layer including the photodiode in the first substrate and the second substrate.

(11)

An imaging system provided with:

a solid-state imaging element including:

a lens;

a first substrate provided with a photodiode that photoelectrically converts incident light to generate a photocurrent; and a second substrate provided with a luminance change detection circuit that detects a change in luminance of the incident light on the basis of a voltage signal converted by a conversion circuit that converts the photocurrent into the voltage signal, the second substrate bonded to the first substrate, the solid-state imaging element including a light shielding unit that is provided in at least any one of the first substrate or the second substrate and shields light between an active element provided in the second substrate and the photodiode; and a signal processing chip that performs signal processing on an output from the solid-state imaging element.

REFERENCE SIGNS LIST

100 Imaging device
110 Imaging lens
120 Recording unit
130 Control unit
200 Solid-state imaging element
201, 201*a* to 201*e* Light reception chip
202 Detection chip
211, 212, 213, 231, 232, 233 Via arrangement unit
220 Light reception unit
221 Photodiode
240 Signal processing circuit
251 Row drive circuit
252 Column drive circuit
260 Address event detection unit
300 Address event detection circuit
310 Current-voltage conversion circuit
311 Conversion transistor
331, 333 Capacitor
312 Current source transistor
313 Voltage supply transistor
320 Buffer
330 Subtractor
332 Inverter
334 Switch
340, 340*a* Quantizer
341 Comparator
350 Transfer circuit
400, 410 Semiconductor layer
500 First wiring layer
510 Second wiring layer
600 On-chip lens
700, 730 Light shielding film
701, 710 to 713, 721 to 723 Light shielding wiring
740 Light shielding member
M Multilayer wiring
M1 First wiring
M2 Second wiring
M3 Third wiring
MCu Connection electrode

What is claimed is:

1. A solid-state imaging element, comprising:

a first substrate including a photodiode configured to photoelectrically convert incident light into a photocurrent;

a second substrate including a conversion circuit configured to convert the photocurrent into a voltage signal and a luminance change detection circuit configured to detect a change in luminance of the incident light based on the voltage signal, wherein the second substrate is bonded to the first substrate; and a light shielding unit that is provided in the first substrate and the second substrate and shields light between an active element provided in the second substrate and the photodiode, wherein the light shielding unit includes a light shielding wiring provided in a second wiring layer provided between a semiconductor layer of the second substrate that includes the active element and the first substrate, wherein the light shielding wiring extends beyond the active element in a horizontal direction such that a portion of the light shielding wiring does not overlap the active element in a plan view, and wherein a horizontal length of the non-overlapping portion of the light shielding wiring is greater than a vertical length between the light shielding wiring and the active element.

2. The solid-state imaging element according to claim 1, wherein the light shielding unit further includes a light shielding film provided in a first wiring layer provided between a semiconductor layer of the first substrate that includes the photodiode and the second substrate.

3. The solid-state imaging element according to claim 2, wherein the light shielding film is provided in a region overlapping, in a plan view, a light reception region in which a plurality of photodiodes is arranged.

4. The solid-state imaging element according to claim 2, wherein the light shielding film is provided between a wiring closest to the semiconductor layer among a multilayer wiring provided in the first wiring layer and the semiconductor layer.

5. The solid-state imaging element according to claim 1, wherein the light shielding unit further includes a light shielding wiring provided in a first wiring layer provided between a semiconductor layer of the first substrate that includes the photodiode and the second substrate.

6. The solid-state imaging element according to claim 5, wherein the light shielding wiring includes a plurality of wiring layers that at least partially overlap in a plan view.

7. The solid-state imaging element according to claim 1, wherein the light shielding wiring includes a plurality of wiring layers that at least partially overlap in a plan view.

8. The solid-state imaging element according to claim 1, wherein the light shielding unit further includes a connection electrode that electrically connects the first substrate to the second substrate.

9. The solid-state imaging element according to claim 1, further comprising:

a light shielding member embedded in a trench extending from a boundary region between adjacent photodiodes into a first wiring layer provided between a semiconductor layer of the first substrate that includes the photodiode and the second substrate.

10. An imaging system, comprising:

a solid-state imaging element including:

a lens;

a first substrate including a photodiode configured to photoelectrically convert incident light into a photocurrent;

a second substrate including a conversion circuit configured to convert the photocurrent into a voltage signal and a luminance change detection circuit configured to detect a change in luminance of the incident light based on the voltage signal, wherein the second substrate is bonded to the first substrate; and a light shielding unit that is provided in the first substrate and the second substrate and shields light between an active element provided in the second substrate and the photodiode, wherein the light shielding unit includes a light shielding wiring provided in a second wiring layer provided between a semiconductor layer of the second substrate that includes the active element and the first substrate, wherein the light shielding wiring extends beyond the active element in a horizontal direction such that a portion of the light shielding wiring does not overlap the active element in a plan view, and wherein a horizontal length of the non-overlapping portion of the light shielding wiring is greater than a vertical length between the light shielding wiring and the active element; and a signal processing chip that performs signal processing on an output from the solid-state imaging element.

11. The imaging system according to claim 10, wherein the light shielding unit further includes a light shielding film provided in a first wiring layer provided between a semiconductor layer of the first substrate that includes the photodiode and the second substrate.

12. The imaging system according to claim 11, wherein the light shielding film is provided in a region overlapping, in a plan view, a light reception region in which a plurality of photodiodes is arranged.

13. The imaging system according to claim 11, wherein the light shielding film is provided between a wiring closest to the semiconductor layer among a multilayer wiring provided in the first wiring layer and the semiconductor layer.

14. The imaging system according to claim 10, wherein the light shielding unit further includes a light shielding wiring provided in a first wiring layer provided between a semiconductor layer of the first substrate that includes the photodiode and the second substrate.

15. The imaging system according to claim 14, wherein the light shielding wiring includes a plurality of wiring layers that at least partially overlap in a plan view.

16. The imaging system according to claim 15, wherein a horizontal extent of a non-overlapping portion of a first wiring layer of the plurality of wiring layers relative to a second wiring layer of the plurality of wiring layers is greater than a vertical spacing between the first wiring layer and the second wiring layer.

17. The imaging system according to claim 10, wherein the light shielding wiring includes a plurality of wiring layers that at least partially overlap in a plan view.

18. The imaging system according to claim 10, wherein the light shielding unit further includes a connection electrode that electrically connects the first substrate to the second substrate.

19. The imaging system according to claim 10, further comprising:

a light shielding member embedded in a trench extending from a boundary region between adjacent photodiodes into a first wiring layer provided between a semiconductor layer of the first substrate that includes the photodiode and the second substrate.

20. The solid-state imaging element according to claim 6, wherein a horizontal extent of a non-overlapping portion of a first wiring layer of the plurality of wiring layers relative to a second wiring layer of the plurality of wiring layers is greater than a vertical spacing between the first wiring layer and the second wiring layer.

* * * * *